US011050955B2

(12) United States Patent
Sakano et al.

(10) Patent No.: US 11,050,955 B2
(45) Date of Patent: Jun. 29, 2021

(54) SOLID-STATE IMAGING DEVICE, METHOD FOR DRIVING SOLID-STATE IMAGING DEVICE, AND ELECTRONIC APPARATUS

(71) Applicant: SONY CORPORATION, Tokyo (JP)

(72) Inventors: Yorito Sakano, Kanagawa (JP); Isao Hirota, Kanagawa (JP); Motonobu Torii, Fukuoka (JP); Masaaki Takizawa, Kanagawa (JP); Junichiro Azami, Kanagawa (JP); Motohashi Yuichi, Tokyo (JP); Atsushi Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/664,225

(22) Filed: Oct. 25, 2019

(65) Prior Publication Data

US 2020/0059615 A1 Feb. 20, 2020

Related U.S. Application Data

(63) Continuation of application No. 15/556,866, filed as application No. PCT/JP2016/056613 on Mar. 3, 2016, now Pat. No. 10,498,983.

(30) Foreign Application Priority Data

Mar. 16, 2015 (JP) ................................ 2015-052344

(51) Int. Cl.
*H04N 5/355* (2011.01)
*H04N 5/3745* (2011.01)
(Continued)

(52) U.S. Cl.
CPC ....... *H04N 5/3559* (2013.01); *H04N 5/35563* (2013.01); *H04N 5/378* (2013.01); *H04N 5/37457* (2013.01); *H01L 27/14641* (2013.01)

(58) Field of Classification Search
CPC ............. H04N 5/3559; H04N 5/37457; H04N 5/35563; H04N 5/378; H01L 27/14641
See application file for complete search history.

(56) References Cited

U.S. PATENT DOCUMENTS

| 2008/0036888 A1* | 2/2008 | Sugawa ............. H04N 5/37457 348/294 |
| 2012/0242875 A1* | 9/2012 | Nakamura ........ H01L 27/14689 348/294 |
| 2013/0256510 A1* | 10/2013 | Lyu .................... H04N 5/37457 250/208.1 |

FOREIGN PATENT DOCUMENTS

| JP | 2010-283573 | 12/2010 |
| JP | 2012-090144 | 5/2012 |

(Continued)

OTHER PUBLICATIONS

Official Action (with English translation) for Japanese Patent Application No. 2017-506199, dated Sep. 3, 2019, 5 pages.
(Continued)

*Primary Examiner* — Ahmed A Berhan
(74) *Attorney, Agent, or Firm* — Sheridan Ross P.C.

(57) ABSTRACT

The present technology relates to a solid-state imaging device, a method for driving the solid-state imaging device, and an electronic apparatus, the solid-state imaging device being capable of expanding the dynamic range without deteriorating the image quality. The solid-state imaging device includes a pixel array section having a plurality of unit pixels and a drive section. Each of the unit pixels includes a first photoelectric conversion section, a second photoelectric conversion section which is less sensitive than the first photoelectric conversion section, a charge storage section configured to store charges generated by the second photoelectric conversion section, a charge-voltage conversion section, a first transfer gate section configured to
(Continued)

transfer charges from the first photoelectric conversion section, and a second transfer gate section configured to combine the potential of the charge-voltage conversion section with the potential of the charge storage section. The present technology is applicable to solid-state imaging devices, for example.

16 Claims, 23 Drawing Sheets

(51) Int. Cl.
*H04N 5/378* (2011.01)
*H01L 27/146* (2006.01)

(56) References Cited

FOREIGN PATENT DOCUMENTS

| | | |
|---|---|---|
| JP | 2013-055500 | 3/2013 |
| JP | 2013-211615 | 10/2013 |

OTHER PUBLICATIONS

Official Action (with English translation) for Chinese Patent Application No. 201680014442.9, dated Aug. 1, 2019, 20 pages.
Official Action (no English translation available) for Japanese Patent Application No. 2017-506199, dated Nov. 19, 2019, 4 pages.

* cited by examiner

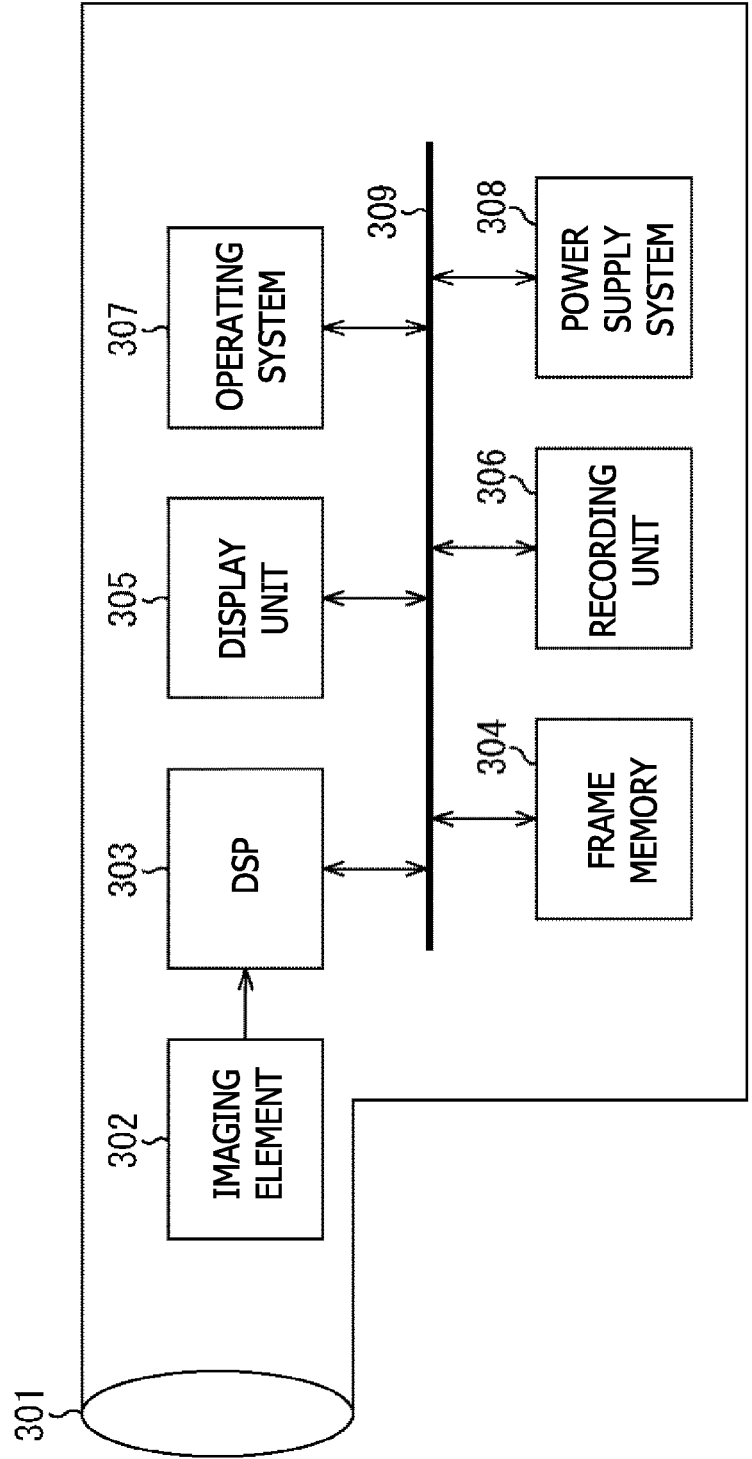

SOLID-STATE IMAGING DEVICE, METHOD FOR DRIVING SOLID-STATE IMAGING DEVICE, AND ELECTRONIC APPARATUS

CROSS REFERENCE TO RELATED APPLICATIONS

This application is a continuation of U.S. application Ser. No. 15/556,866, filed Sep. 8, 2017, which is a national stage application under 35 U.S.C. 371 and claims the benefit of PCT Application No. PCT/JP2016/056613 having an international filing date of Mar. 3, 2016, which designated the United States, which PCT application claimed the benefit of Japanese Patent Application No. 2015-052344 filed Mar. 16, 2015, the disclosures of which are incorporated herein by reference in their entirety.

TECHNICAL FIELD

The present technology relates to a solid-state imaging device, a method for driving the solid-state imaging device, and an electronic apparatus. More particularly, the present technology relates to a solid-state imaging device which is so designed as to have its dynamic range expanded, a method for driving the solid-state imaging device, and an electronic apparatus.

BACKGROUND ART

There have been a variety of technologies to expand the dynamic range of solid-state imaging devices.

A known method among them is, for example, the time-sharing system which composed of taking a plurality of images at certain intervals with varied sensitivities and then synthesizing the thus taken images into a single image.

Another known method is, for example, the space-sharing system which composed of providing light-receiving elements different from each other in sensitivity and allowing the light-receiving elements differing in sensitivity to capture a plurality of images and then synthesizing the thus captured images into a single image, thereby expanding the dynamic range. (See, PTLs 1 and 2, for example.)

Moreover, there is known the in-pixel memory system to expand the dynamic range. According to this system, each pixel is provided therein with a memory which stores charges overflowing from the photodiode so as to increase the amount of charges that can be stored in one exposure period. (See, PTL 3, for example.)

CITATION LIST

Patent Literature

[PTL 1]
JP 3071891B
[PTL 2]
JP 2006-253876A
[PTL 3]
JP 4317115B

SUMMARY

Technical Problems

Although the time-sharing system and space-sharing system mentioned above permit the dynamic range to expand as the number of division increases, the increased number of division tends to deteriorate the image quality due to the occurrence of artifacts and the decrease in resolution.

Moreover, the in-pixel memory system has a disadvantage that the memory is limited in capacity and this restricts the expansion of dynamic range.

Thus, the present technology is intended to allow a solid-state imaging device to increase in dynamic range without deterioration in the image quality.

Solution to Problems

A solid-state imaging device according to a first aspect of the present technology includes a pixel array section configured to have a plurality of unit pixels arranged therein, and a drive section configured to control action of the unit pixels. Each of the unit pixels includes a first photoelectric conversion section, a second photoelectric conversion section which is less sensitive than the first photoelectric conversion section, a charge storage section configured to store charges generated by the second photoelectric conversion section, a charge-voltage conversion section, a first transfer gate section configured to transfer charges from the first photoelectric conversion section to the charge-voltage conversion section, and a second transfer gate section configured to combine potential of the charge-voltage conversion section with potential of the charge storage section.

The unit pixel may further include a third transfer gate section configured to transfer charges from the second photoelectric conversion section to the charge storage section, and an overflow path which is formed under the gate electrode of the third transfer gate section and transfers overflown charges from the second photoelectric conversion section to the charge storage section.

The second photoelectric conversion section and the charge storage section may be connected to each other, with a transfer gate section omitted.

The unit pixel may further include a fourth transfer gate section which is connected between the second transfer gate section and the charge-voltage conversion section.

The drive section may be configured to make the fourth transfer gate section conductive or non-conductive when a signal based on charges generated by the first photoelectric conversion section is read out.

The drive section may be configured to make the second transfer gate section non-conductive when a first data signal based on charges generated by the first photoelectric conversion section is read out and also make the second transfer gate section conductive when a second data signal based on charges generated by the second photoelectric conversion section is read out.

When reading out the first data signal, the drive section may read out the first data signal after a first reset signal has been read out, with the charge-voltage conversion section kept reset, and when reading out the second data signal, the drive section may read out a second reset signal after the second data signal has been read out, with the region kept reset in which potential of the charge-voltage conversion section is combined with potential of the charge storage section.

The solid-state imaging device may further include a signal processing section configured to generate a first difference signal representing difference between the first data signal and the first reset signal and a second difference signal representing difference between the second data signal and the second reset signal, use the first difference signal for a pixel signal of the unit pixel if the first difference signal has a value equal to or lower than a given threshold value, and use the second difference signal for a pixel signal of the unit pixel if the first difference signal has a value exceeding the threshold value.

The solid-state imaging device may further include a signal processing section configured to generate pixel signals of the unit pixels by generating a first difference signal representing difference between the first data signal and the first reset signal and a second difference signal representing difference between the second data signal and the second reset signal, and then synthesizing the first difference signal and the second difference signal according to a synthesis ratio set up based on the value of the first difference signal.

The charge storage section may have its counter electrode connected to a variable voltage source, and the drive section may keep voltage applied to the counter electrode of the charge storage section in a period for storing charges in the charge storage section lower than in a period in which signals based on charges stored in the charge storage section are read out.

In a method for driving a solid-state imaging device according to a second aspect of the present technology, the solid-state imaging device including a pixel array section configured to have a plurality of unit pixels arranged therein, each of the unit pixels including a first photoelectric conversion section, a second photoelectric conversion section which is less sensitive than the first photoelectric conversion section, a charge storage section, a charge-voltage conversion section, a first transfer gate section configured to transfer charges from the first photoelectric conversion section to the charge-voltage conversion section, and a second transfer gate section configured to combine potential of the charge-voltage conversion section with potential of the charge-storage section. The method includes storing charges generated by the second photoelectric conversion section in the charge storage section; when a first data signal based on charges generated by the first photoelectric conversion section is read out, making the second transfer gate section non-conductive and transferring charges stored in the first photoelectric conversion section to the charge-voltage conversion section; and when a second data signal based on charges generated by the second photoelectric conversion section is read out, making the second transfer gate section conductive and combining potential of the charge-voltage conversion section with potential of the charge storage section.

An electronic apparatus according to a third aspect of the present technology includes a solid-state imaging device including a pixel array section configured to have a plurality of unit pixels arranged therein, and a drive section configured to control action of the unit pixels. Each of the unit pixels includes a first photoelectric conversion section, a second photoelectric conversion section which is less sensitive than the first photoelectric conversion section, a charge storage section configured to store charges generated by the second photoelectric conversion section, a charge-voltage conversion section, a first transfer gate section configure to transfer charges from the first photoelectric conversion section to the charge-voltage conversion section, and a second transfer gate section configured to combine potential of the charge-voltage conversion section with potential of the charge-storage section.

According to the first and third aspects of the present technology, charges are transferred from the first photoelectric conversion section to the charge-voltage conversion section, the charges generated by the second photoelectric conversion section are stored in the charge storage section, and the potential of the charge-voltage conversion section is combined with the potential of the charge storage section.

According to the second aspect of the present technology, the charges generated by the second photoelectric conversion section are stored in the charge storage section, and the first data signal based on the charges generated by the first photoelectric conversion section is read out in such a way that the second transfer gate section is kept non-conductive so that the charges stored in the first photoelectric conversion section are transferred to the charge-voltage conversion section, and the second data signal based on the charges generated by the second photoelectric conversion section is read out in such a way that the second transfer gate section is kept conductive so that the potential of the charge-voltage conversion section is combined with the potential of the charge storage section.

Advantageous Effect of Invention

According to the first to third aspects of the present technology, it is possible to provide the solid-state imaging device with an expanded dynamic range without deterioration in image quality.

BRIEF DESCRIPTION OF DRAWINGS

FIG. 23 is a block diagram depicting an example of a structure of an electronic apparatus.

DESCRIPTION OF EMBODIMENTS

In what follows, the embodiments of the present invention will be described in more detail with reference to the accompanying drawings. The description will proceed in the following order.
1. Solid-state imaging device to which present technology is applied
2. First embodiment
3. Second embodiment (in which the counter electrode of the charge storage section is given a variable voltage)
4. Third embodiment (in which the third transfer gate section is eliminated)
5. Fourth embodiment (in which the high-sensitivity data signal is read out with a variable conversion efficiency)
6. Fifth embodiment (in which the high-sensitivity data signal is read out with a variable conversion efficiency, and the third transfer gate section is eliminated)
7. Description of noise removal processing and arithmetic processing
8. Modified examples
9. Examples of use of solid-state imaging device
1. Solid-state imaging device to which present technology is applied
{1-1. Basic System Structure}

Figure 1:
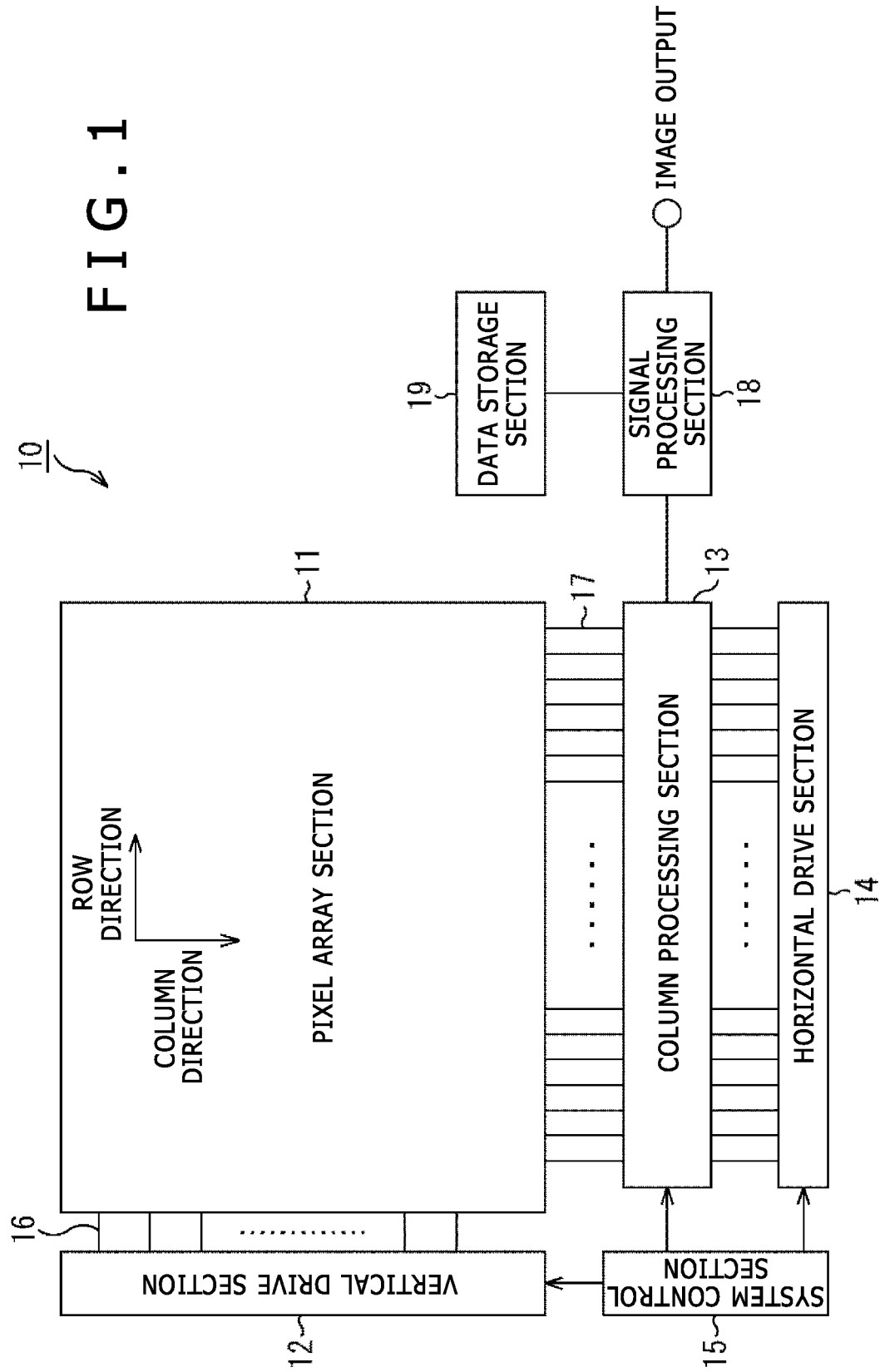
FIG. 1 is a schematic diagram depicting a system structure of a CMOS (Complementary Metal Oxide Semiconductor) image sensor to which the present technology is applied.

FIG. 1 is a schematic diagram of the system structure for the solid-state imaging device to which the present technology is applied, the solid-state imaging device typically including the CMOS image sensor as a species of the solid-state imaging device of X-Y addressing type. Here, the CMOS image sensor is defined as an image sensor which is produced entirely or partly by the CMOS process.

A CMOS image sensor 10 pertaining to the present application example includes a pixel array section 11, which is formed on a semiconductor substrate or chip (not depicted), and a peripheral circuit section, which is formed by integration on the same semiconductor substrate as that for the pixel array section 11. The peripheral circuit section includes, for example, a vertical drive section 12, a column processing section 13, a horizontal drive section 14, and a system control section 15.

The CMOS image sensor 10 further includes a signal processing section 18 and a data storage section 19. The signal processing section 18 and the data storage section 19 may be mounted on the same substrate as that for the CMOS image sensor 10 or may be mounted on a different substrate from the CMOS image sensor 10. Incidentally, processing by the signal processing section 18 and the data storage section 19 may be replaced by the processing which is accomplished by a DSP (Digital Signal Processor) circuit or software. DSP is an external signal processing section which is formed on a substrate separate from that for the CMOS image sensor 10.

The pixel array section 11 is composed of unit pixels (simply referred to a "pixel" occasionally hereinafter) which are arranged in the row direction and column direction or arranged two-dimensionally in the matrix pattern. Each of the unit pixels has the photoelectric conversion section which generates charge in response to the amount of light received and then stores the thus generated charge. Here, the row direction refers to the horizontal direction in which the pixels in the pixel rows are arranged, and the column direction refers to the vertical direction in which the pixels in the pixel columns are arranged. A detailed description will be given later for the specific circuit structure of the unit pixels and the specific pixel structure of the unit pixels.

The pixel array section 11 is provided with the pixel drive lines 16 and the vertical signal lines 17. The pixel drive lines 16 are arranged in the row direction for individual pixel rows, and the vertical signal lines 17 are arranged in the column direction for individual pixel columns for pixel array in the matrix pattern. The pixel drive lines 16 transmit drive signals to read out signals from the pixels. In FIG. 1, each of the pixel drive lines 16 is depicted as a single line but this is not limited to single line. The pixel drive line 16 has its one end connected to the output terminal (corresponding to each row) of the vertical drive section 12.

The vertical drive section 12 is composed of shift registers and address decoders, and it drives the individual pixels of the pixel array section 11 all at once or row by row. In other words, the vertical drive section 12 constitutes the drive section to control the action of each pixel of the pixel array section 11, in combination with the system control section 15 to control the vertical drive section 12. The vertical drive section 12 is usually composed of two scanning systems (one for read out and one for sweep out), although its detailed structure is not depicted.

The read-out scanning system performs selective scans sequentially row by row for the unit pixels of the pixel array section 11 so as to read out signals from the unit pixels. The signals read out from the unit pixels are analog signals. The sweep-out scanning system performs sweep-out scan for the row on which the read-out scan system performs read-out scan. The scan by the sweep-out scanning system precedes the read-out scan by a period of exposure.

The sweep-out scanning system performs sweep-out scan to sweep out unnecessary charges from the photoelectric conversion section of the unit pixels in the read-out row, and this resets the photoelectric conversion section. The sweeping out of unnecessary charges (or the resetting) by the sweep-out scanning system permits the so-called electronic shutter to act. The action of the electronic shutter means discarding charges in the photoelectric conversion section and starting exposure again (or starting to store charges again).

The read-out action by the read-out scanning system reads out the signals which correspond to the amount of light received just before the read-out action or after the action of the electronic shutter. The period between the timing of read out by the immediately preceding read-out action (or the timing for sweep out by the action of the electronic shutter) and the timing of read out by the action of read out (which has just occurred) corresponds to the period of exposure for charges in the unit pixel.

The vertical drive section 12 selectively scans all the unit pixels in the pixel row, thereby outputting signals, which subsequently enter the column processing section 13 through the vertical signal lines 17 for each pixel row. The column processing section 13 performs prescribed signal processing for signals output through the vertical signal lines 17 from individual pixels of the selected row. This step is applied to each pixel column in the pixel array section 11. After signal processing, the pixel signals are temporarily stored.

To be more specific, the column processing section 13 performs signal processing which includes at least noise removal processing, CDS (Correlated Double Sampling) processing, and DDS (Double Data Sampling) processing. The CDS processing removes fixed pattern noise inherent to the pixel (which results from reset noise and the fluctuation of threshold values of the amplifying transistors in the pixel). The column processing section 13 may be provided with the AD (Analog-Digital) conversion function in addition to noise removal function, so that it becomes capable of converting analog pixel signals into digital pixel signals as outputs.

The horizontal drive section 14 is composed of shift registers and address decoders; it sequentially selects the unit circuit corresponding to the pixel column of the column processing section 13. The horizontal drive section 14 performs selective scanning, so that the pixel signals which have been processed for the unit circuit in the column processing section 13 are sequentially output.

The system control section 15 is composed of timing generators to generate various kinds of timing signals. The timing generators generate various kinds of timing signals which are necessary to drive and control the vertical drive section 12, the column processing section 13, and the horizontal drive section 14.

The signal processing section 18 possesses at least the arithmetic processing function; it performs various signal processing (including arithmetic processing) on pixel signals output from the column processing section 13. The data storage section 19 temporarily stores data necessary for the signal processing by the signal processing section 18.

{1-2. Another System Structure}

The CMOS image sensor 10 to which the present technology is applied is not restricted to that of the system structure mentioned above. Another system structure includes the following.

Figure 2:
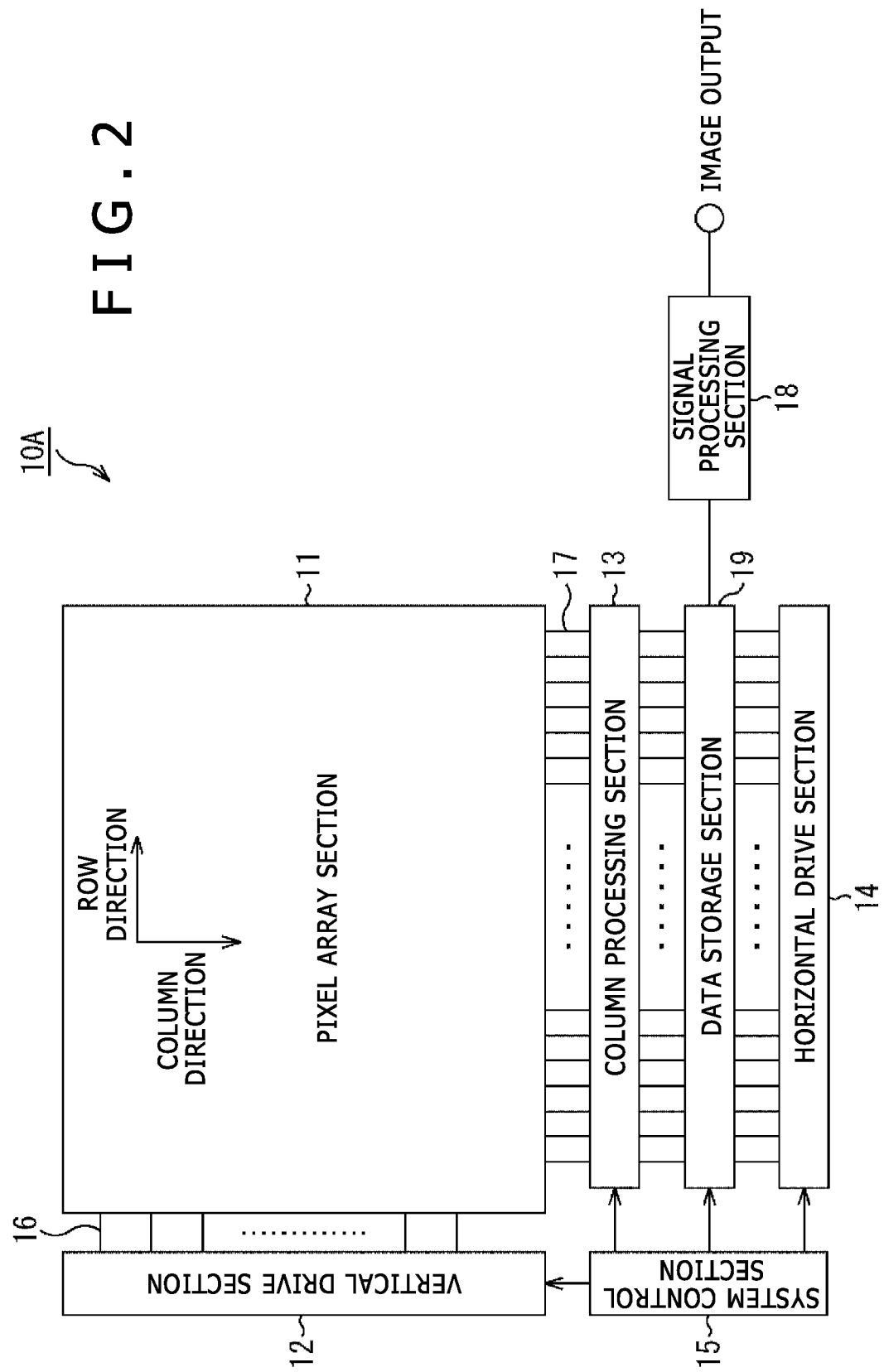
FIG. 2 is a schematic diagram depicting a first example of the structure of the CMOS image sensor to which the present technology is applied.

An example of a CMOS image sensor 10A is depicted in FIG. 2. The CMOS image sensor 10A has the data storage section 19 which is placed behind the column processing section 13, so that the pixel signals output from the column processing section 13 are sent to the signal processing section 18 through the data storage section 19.

Figure 3:
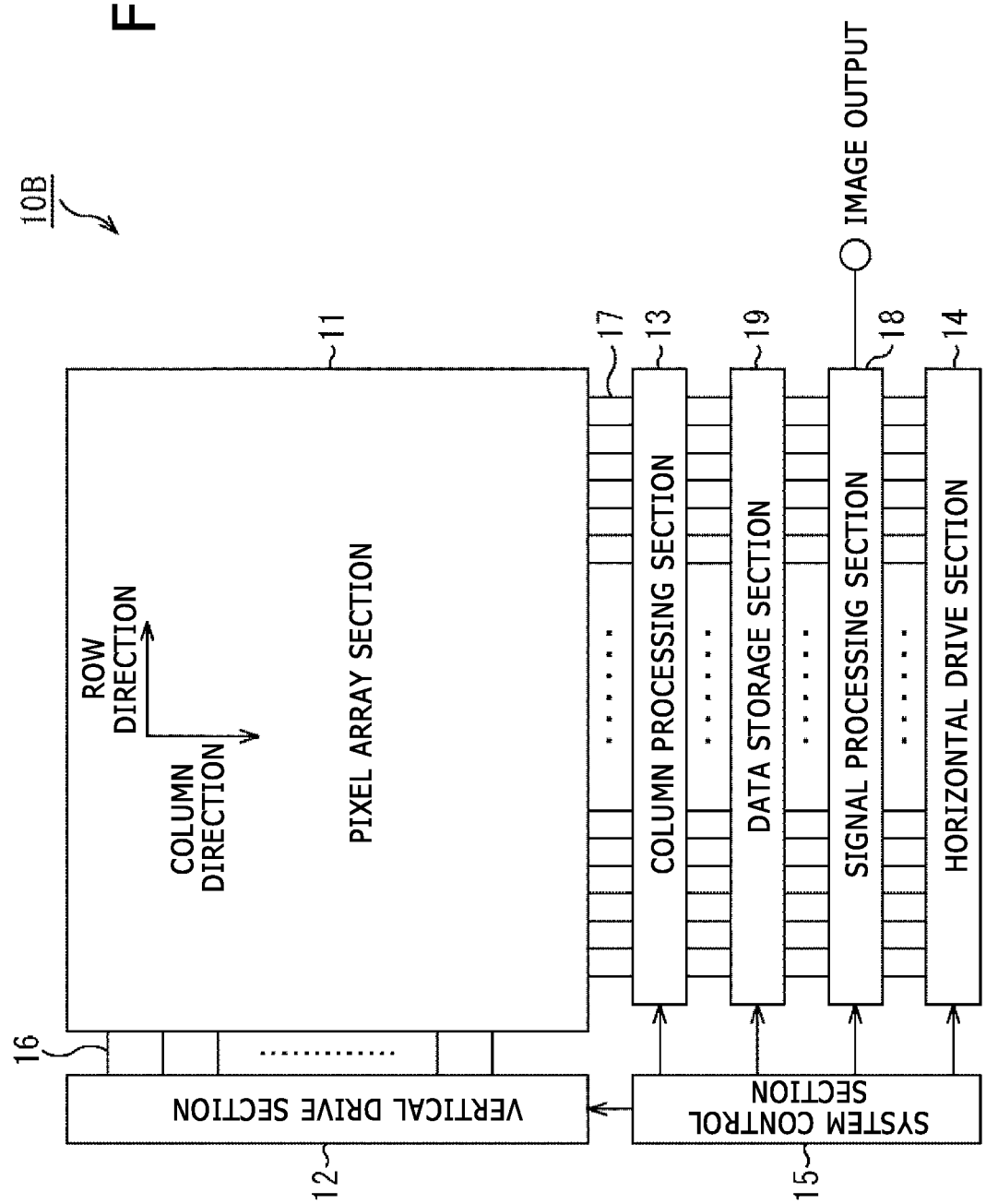
FIG. 3 is a schematic diagram depicting a second example of the structure of the CMOS image sensor to which the present technology is applied.

Another example of a CMOS sensor 10B is depicted in FIG. 3. It is modified such that the column processing section 13 is provided with the AD converting function (which performs AD conversion for each row or a plurality of rows in the pixel array section 11) and the data storage section 19 and the signal processing section 18 are arranged parallel to each other for the column processing section 13.

2. First Embodiment

A first embodiment of the present technology will be described below with reference to FIGS. 4 to 7.

{Circuit Structure of Unit Pixel 100A}

Figure 4:
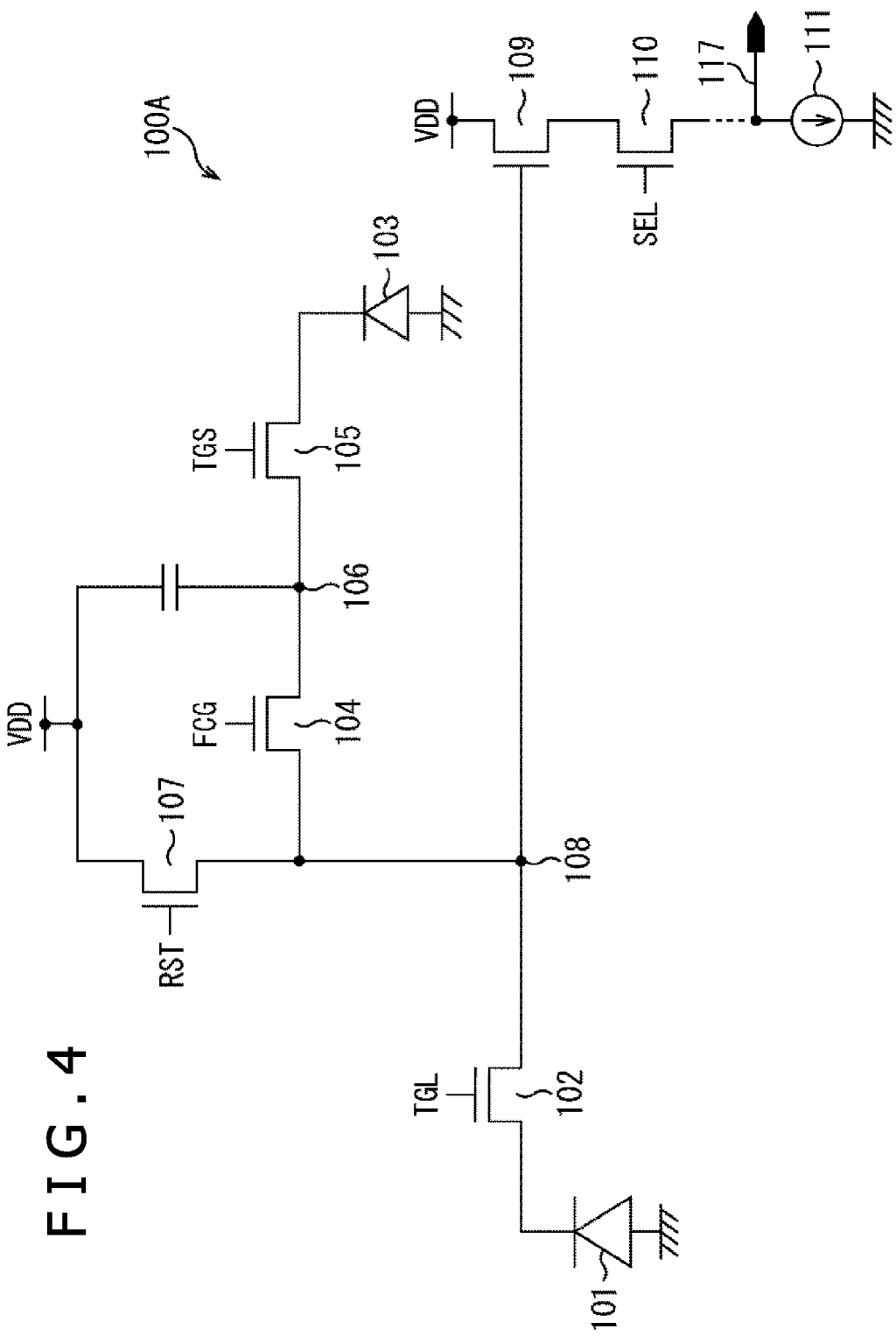
FIG. 4 is a circuit diagram depicting an example of a structure of a unit pixel according to a first embodiment of the present technology.

FIG. 4 is a circuit diagram illustrating an example of the structure of the unit pixel 100A which is arranged in the pixel array section 11 depicted in FIGS. 1 to 3.

The unit pixel 100A includes a first photoelectric conversion section 101, a first transfer gate section 102, a second photoelectric conversion section 103, a second transfer gate section 104, a third transfer gate section 105, a charge storage section 106, a reset gate section 107, an FD (Floating Diffusion) section 108, an amplifying transistor 109, and a selective transistor 110.

Each row composed of a plurality of the unit pixel 100A is provided with the drive line which is depicted as the pixel drive line 16 in FIGS. 1 to 3. Moreover, a variety of drive signals, such as TGL, TGS, FCG, RST, and SEL, are supplied through a plurality of drive lines from the vertical drive section 12 depicted in FIGS. 1 to 3. Since each transistor in the unit pixel 100A is an NMOS (N-channel Metal Oxide Semiconductor) transistor, these drive signals are pulse signals which are active at a high level (e.g., power source voltage VDD) and non-active at a low level (e.g., negative potential).

The first photoelectric conversion section 101 is a photodiode of PN (Positive/Negative) junction type. It generates charges in response to the amount of light received and stores the charges.

The first transfer gate section 102 is connected between the first photoelectric conversion section 101 and the FD section 108. The gate electrode of the first transfer gate section 102 is given the drive signal TGL. When the drive signal TGL becomes active, the first transfer gate section 102 becomes conductive, so that the charge stored in the first photoelectric conversion section 101 is transferred to the FD section 108 through the first transfer gate section 102.

The second photoelectric conversion section 103 is a photodiode of PN junction type as in the case of the first photoelectric conversion section 101. The second photoelectric conversion section 103 generates charges in response to the amount of light received and stores the charges.

Comparison between the first photoelectric conversion section 101 and the second photoelectric conversion section 103 reveals that the first photoelectric conversion section 101 has a large light-receiving region and a high sensitivity and the second photoelectric conversion section 103 has a small light-receiving region and a low sensitivity.

The second transfer gate section 104 is connected between the charge storage section 106 and the FD section 108. The gate electrode of the second transfer gate section 104 is given the drive signal FCG. When the drive signal FCG becomes active, the second transfer gate section 104 becomes conductive so as to combine together the potential of the charge storage section 106 and the potential of the FD section 108.

The third transfer gate section 105 is connected between the second photoelectric conversion section 103 and the charge storage section 106. The gate electrode of the third transfer gate section 105 is given a drive signal TGS. As soon as the drive signal TGS becomes active, the third transfer gate section 105 becomes conductive, so that the charge which has been stored in the second photoelectric conversion section 103 is transferred through the third transfer gate section 105 to the charge storage section 106 or to that region where the potential of the charge storage section 106 and the potential of the FD section 108 are combined together.

The lower part of the gate electrode of the third transfer gate section 105 has a slightly deeper potential, so that it forms an overflow path which transfers to the charge storage section 106 the charge which exceeds the amount of saturated charge of the second photoelectric conversion section 103 and which overflows from the second photoelectric conversion section 103. Incidentally, the overflow path formed under the gate electrode of the third transfer gate section 105 will hereinafter be simply referred to as the overflow path of the third transfer gate section 105.

The charge storage section 106 is a capacitor, for example; it is connected between the second transfer gate section 104 and the third transfer gate section 105. The charge storage section 106 has its counter electrode connected to the power source voltage VDD which supplies the power source voltage VDD. The charge storage section 106 stores charges transferred from the second photoelectric conversion section 103.

The reset gate section 107 is connected between the power source voltage VDD and the FD section 108. The gate electrode of the reset gate section 107 is given the drive signal RST. As soon as the drive signal RST becomes active, the reset gate section 107 becomes conductive and the FD section 108 has its potential reset to the level of the power source voltage VDD.

The FD section 108 performs charge-voltage conversion or converts the charge into the voltage signal and outputs the result of conversion.

The amplifying transistor 109 has its gate electrode connected to the FD section 108 and also has its drain electrode connected to the power source voltage VDD, and hence it functions as an input section of the so-called source-follower circuit, which is a circuit to read out the charge held in the FD section 108. In other words, since the source electrode is connected to a vertical signal line 17 through the selective transistor 110, the amplifying transistor 109 constitutes the source follower circuit in conjunction with a constant current source 111 connected to one end of the vertical signal line 17.

The selective transistor 110 is connected between the source electrode of the amplifying transistor 109 and the vertical signal line 17. The gate electrode of the selective transistor 110 is given the drive signal SEL. As soon as the drive signal SEL becomes active, the selective transistor 110 becomes conductive and the unit pixel 100A assumes the selected state. Thus, the pixel signal output from the amplifying transistor 109 is output to the vertical signal line 17 through the selective transistor 110.

Incidentally, the following definitions are applied hereinafter. The term "individual drive signals turn on" means that individual drive signals become active. The term "individual drive signals turn off" means that individual drive signals become non-active. Also, the term "each gate section or each transistor turns on" means that each gate section or each transistor becomes conductive. The term "each gate section or each transistor turns off" means that each gate section or each transistor becomes non-conductive.

{Action of Unit Pixel 100A}

The action of the unit pixel 100A is described below with reference to the timing charts depicted in FIGS. 5 and 6.

(Action of Unit Pixel 100A that Takes Place at Start of Exposure)

The action of the unit pixel 100A that takes place at the start of exposure will be described with reference to the timing charts depicted in FIG. 5. This process takes place for each pixel row or a plurality of pixel rows of the pixel array section 11 according to the prescribed scanning sequence. Incidentally, FIG. 5 depicts the timing charts for a horizontal synchronizing signal XHS and the drive signals SEL, RST, TGS, FCG, and TGL.

First, at the time t1, the horizontal synchronizing signal XHS is input so that the process of exposure starts for the unit pixel 100A.

Next, at the time t2, the drive signal RST turns on so that the reset gate section 107 turns on. This step makes the potential of the FD section 108 to reset to the level of the power source voltage VDD.

Next, at the time t3, the drive signals TGL, FCG, and TGS turn on so that the first transfer gate section 102, the second transfer gate section 104, and the third transfer gate section 105 turn on. This step causes the potential of the charge storage section 106 and the potential of the FD section 108 to be combined together. This step also causes the charge stored in the first photoelectric conversion section 101 to be transferred to the combined region through the first transfer gate section 102 and the charge stored in the second photoelectric conversion section 103 to be transferred to the combined region through the third transfer gate section 105. Then, the combined region is reset.

Next, at the time t4, the drive signals TGL and TGS turn off so that the first transfer gate section 102 and the third transfer gate section 105 turn off. This step causes the first photoelectric conversion section 101 and the second photoelectric conversion section 103 to start storing charges. Thus, the period of exposure starts.

Next, at the time t5, the drive signal RST turns off so that the reset gate section 107 turns off.

Next, at the time t6, the drive signal FCG turns off so that the second transfer gate section 104 turns off. As the result, the charge storage section 106 starts storing charges that overflow from the second photoelectric conversion section 103 and are transferred through the overflow path of the third transfer gate section 105.

Finally, at the time t7, the horizontal synchronizing signal XHS is input.

(Action of Unit Pixel 100A that Takes Place at Time of Read Out)

The action of the unit pixel 100A that takes place at the time of read out will be described with reference to the timing charts depicted in FIG. 6. This process takes place for each pixel row or a plurality of pixel rows of the pixel array section 11 according to the prescribed scanning sequence after a prescribed period of time that follows the process depicted in FIG. 5. Incidentally, FIG. 6 depicts the timing charts for the horizontal synchronizing signal XHS and the drive signals SEL, RST, TGS, FCG, and TGL.

First, at the time t21, the horizontal synchronizing signal XHS is input, so that the period of reading out the unit pixel 100A starts.

Next, at the time t22, the drive signal SEL turns on so that the selective transistor 110 turns on. As the result, the unit pixel 100A assumes the selected state.

Next, at the time t23, the drive signal RST turns on so that the reset gate section 107 turns on. As the result, the potential of the FD section 108 is reset to the level of the power source voltage VDD.

Next, at the time t24, the drive signal RST turns off so that the reset gate section 107 turns off.

Next, at the time t25, the drive signals FCG and TGS turn on so that the second transfer gate section 104 and the third transfer gate section 105 turn on. This step causes the potential of the charge storage section 106 and the potential of the FD section 108 to be combined together, and at the same time the charge stored in the second photoelectric conversion section 103 is transferred to the combined region. As the result, the charges stored during the exposure period in the second photoelectric conversion section 103 and the charge storage section 106 are transferred to the combined region.

At the time t25, the reading out of the pixel signal starts and the exposure period comes to an end.

Next, at the time t26, the drive signal TGS turns off so that the third transfer gate section 105 turns off. As the result, the transfer of charges from the second photoelectric conversion section 103 stops.

Next, at the intermediate time to between the time t26 and the time t27, a signal SL, which is based on the potential in the region where the potential of the charge storage section 106 and the potential of the FD section 108 are combined together, is output to the vertical signal line 17 through the amplifying transistor 109 and the selective transistor 110. The signal SL is generated by the second photoelectric conversion section 103 during the exposure period; it is a signal based on the charges stored in the second photoelectric conversion section 103 and the charge storage section 106. Moreover, the signal SL is a signal based on the potential in the region in which the charges stored during the exposure period in the second photoelectric conversion section 103 and the charge storage section 106 are combined together and the potential of the charge storage section 106 and the potential of the FD section 108 are combined together. Consequently, the capacity available for charge-voltage conversion at the time of reading out the signal SL is equal to the capacity resulting from the combination of that of the charge storage section 106 and that of the FD section 108.

Incidentally, the signal SL will be referred to as the low-sensitivity data signal SL hereinafter.

Next, at the time t27, the drive signal RST turns on so that the reset gate section 107 turns on. This resets the region in which potential of the charge storage section 106 and the potential of the FD section 108 have been combined together.

Next, at the time t28, the selective signal SEL turns off so that the selective transistor 110 turns off. As the result, the unit pixel 100A assumes the unselected state.

Next, at the time t29, the drive signal RST turns off so that the reset gate section 107 turns off.

Next, at the time t30, the selective signal SEL turns on so that the selective transistor 110 turns on. As the result, the unit pixel 100A assumes the selected state.

Next, at the intermediate time tb between the time t30 and the time t31, a signal NL, which is based on the potential in the region in which the potential of the charge storage section 106 and the potential of the FD section 108 are combined together, is output to the vertical signal line 17 through the amplifying transistor 109 and the selective transistor 110. This signal NL is a signal which is based on the potential of the region (in its reset state) in which the potential of the charge storage section 106 and the potential of the FD section 108 are combined together.

Incidentally, the signal NL will occasionally be referred to as the low-sensitivity reset signal NL hereinafter.

Next, at the time t31, the drive signal FCG turns off so that the second transfer gate section 104 turns off.

Next, at the intermediate time tc between the time t31 and the time t32, the signal NH which is based on the potential of the FD section 108 is output to the vertical signal line 17 through the amplifying transistor 109 and the selective transistor 110. The signal NH is a signal which is based on the potential of the FD section 108 in its reset state.

Incidentally, the signal NH will occasionally be referred to as the high-sensitivity reset signal NH hereinafter.

Next, at the time t32, the drive signal TGL turns on so that the first transfer gate section 102 turns on. As the result, the charge which has been generated by the first photoelectric conversion section 101 and stored during the exposure period is transferred to the FD section 108 through the first transfer gate section 102.

Next, at the time t33, the drive signal TGL turns off so that the first transfer gate section 102 turns off. As the result, the charge transfer from the first photoelectric conversion section 101 to the FD section 108 stops.

Next, at the intermediate time td between the time t33 and the time t34, a signal SH which is based on the potential of the FD section 108 is output to the vertical signal line 17 through the amplifying transistor 109 and the selective transistor 110. The signal SH is a signal which is generated by the first photoelectric conversion section 101 and is based on the stored charge. Also, the signal SH becomes a signal which is based on the potential of the FD section 108 in such a state that the charge stored in the first photoelectric conversion section 101 during the exposure period has been stored in the FD section 108. Consequently, the capacity for charge-voltage conversion at the time of reading out the signal SH becomes the capacity of the FD section 108, and it is smaller than that at the time when the low-sensitivity data signal SL is read out at the time ta.

Incidentally, the signal SH will occasionally be referred to as the high-sensitivity data signal SH hereinafter.

Next, at the time t34, the selective signal SEL turns off so that the selective transistor 110 turns off. As the result, the unit pixel 100A assumes the unselected state.

Next, at the time t35, the horizontal synchronizing signal XHS is input, and the period for the reading out of the pixel signal of the unit pixel 100A comes to an end.

{Circuit Structure of Unit Pixel 100B}

Figure 7:
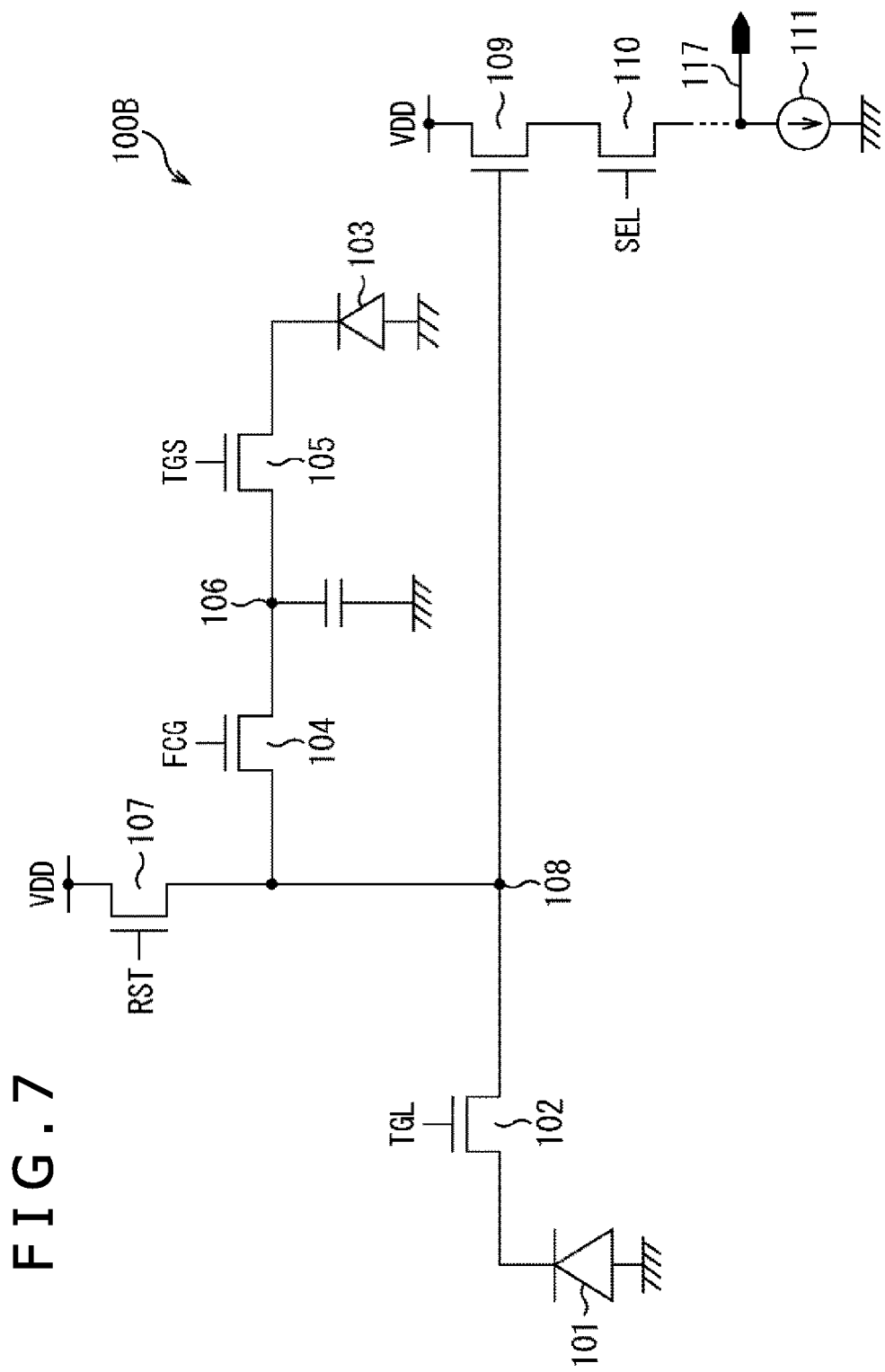
FIG. 7 is a circuit diagram depicting another example of the structure of the unit pixel according to the first embodiment of the present technology.

FIG. 7 is a circuit diagram illustrating an example of the structure of a unit pixel 100B as a modified example of the unit pixel 100A depicted in FIG. 4. Incidentally, those parts corresponding to those parts in FIG. 4 are given identical signs, with their description omitted.

Comparison between the unit pixel 100B and the unit pixel 100A depicted in FIG. 4 reveals that the counter electrode of the charge storage section 106 is placed at a different position. That is, in the unit pixel 100B, the counter electrode of the charge storage section 106 is connected to ground.

Figure 5:
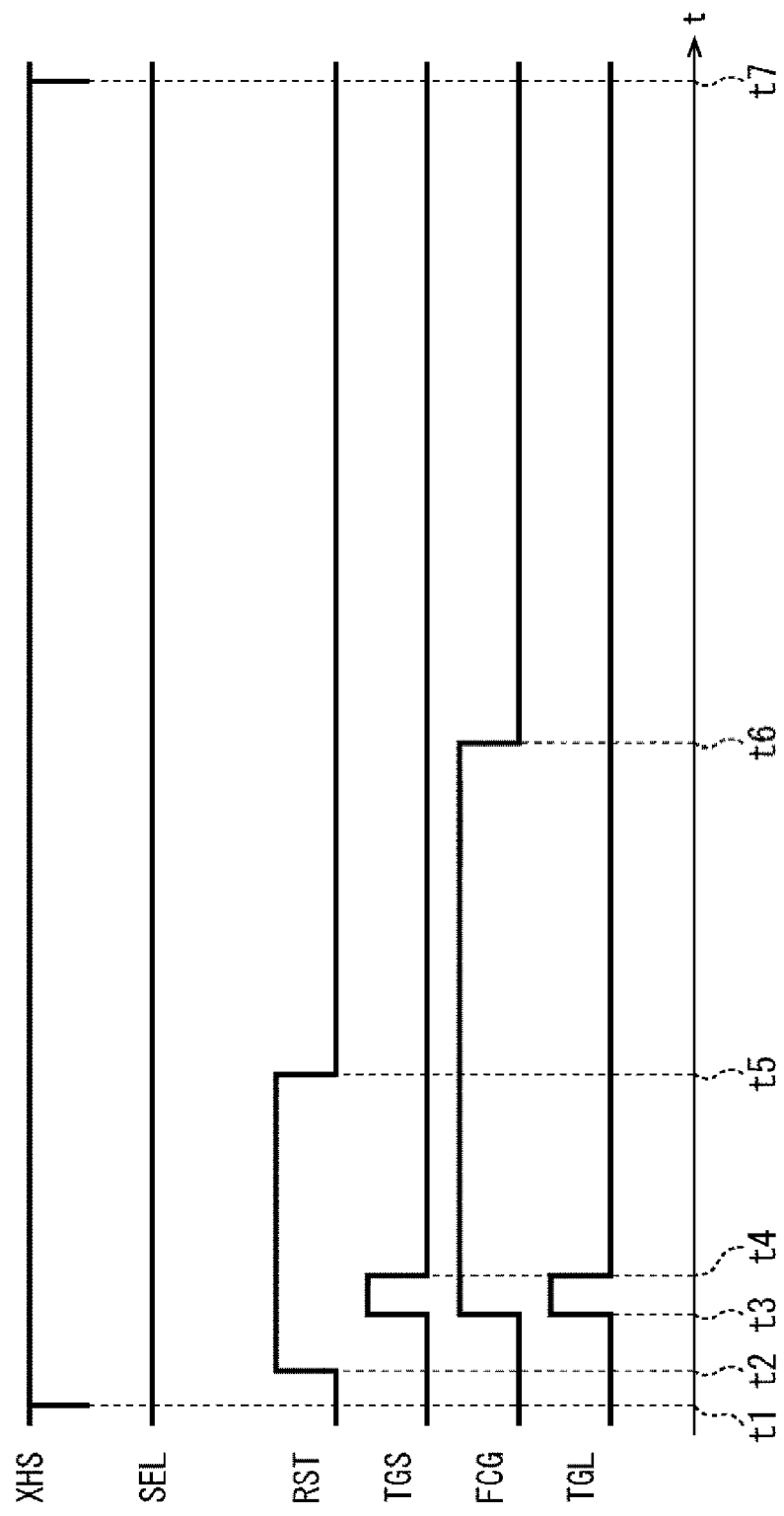
FIG. 5 is a timing chart that explains the action of the unit pixel (depicted in FIG. 4) at the start of exposure.
Figure 6:
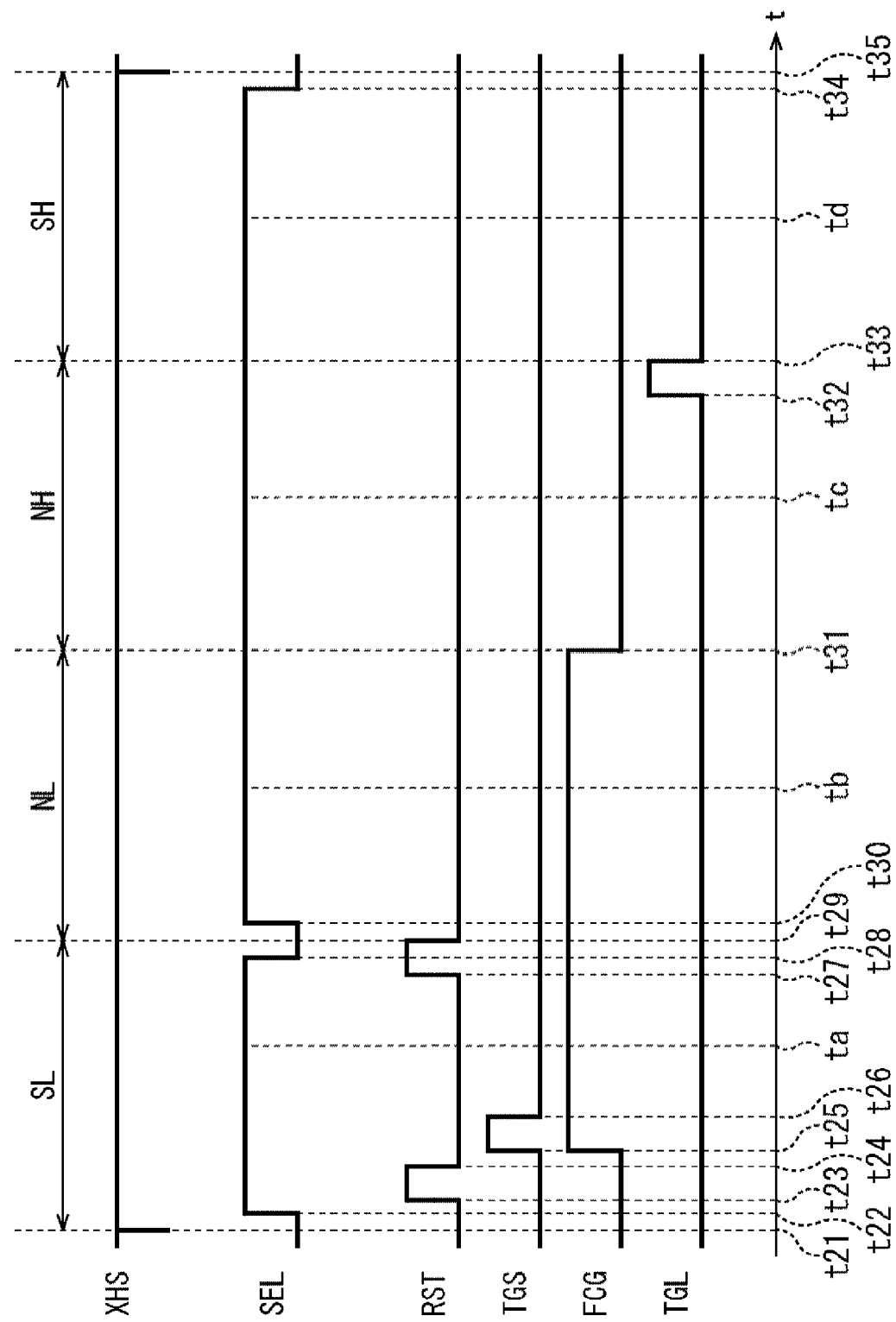
FIG. 6 is a timing chart that explains the action of the unit pixel (depicted in FIG. 4) at the time of read out.

Incidentally, as in the case of the unit pixel 100A, the unit pixel 100B works according to the timing charts depicted in FIGS. 5 and 6.

3. Second Embodiment

Figure 9:
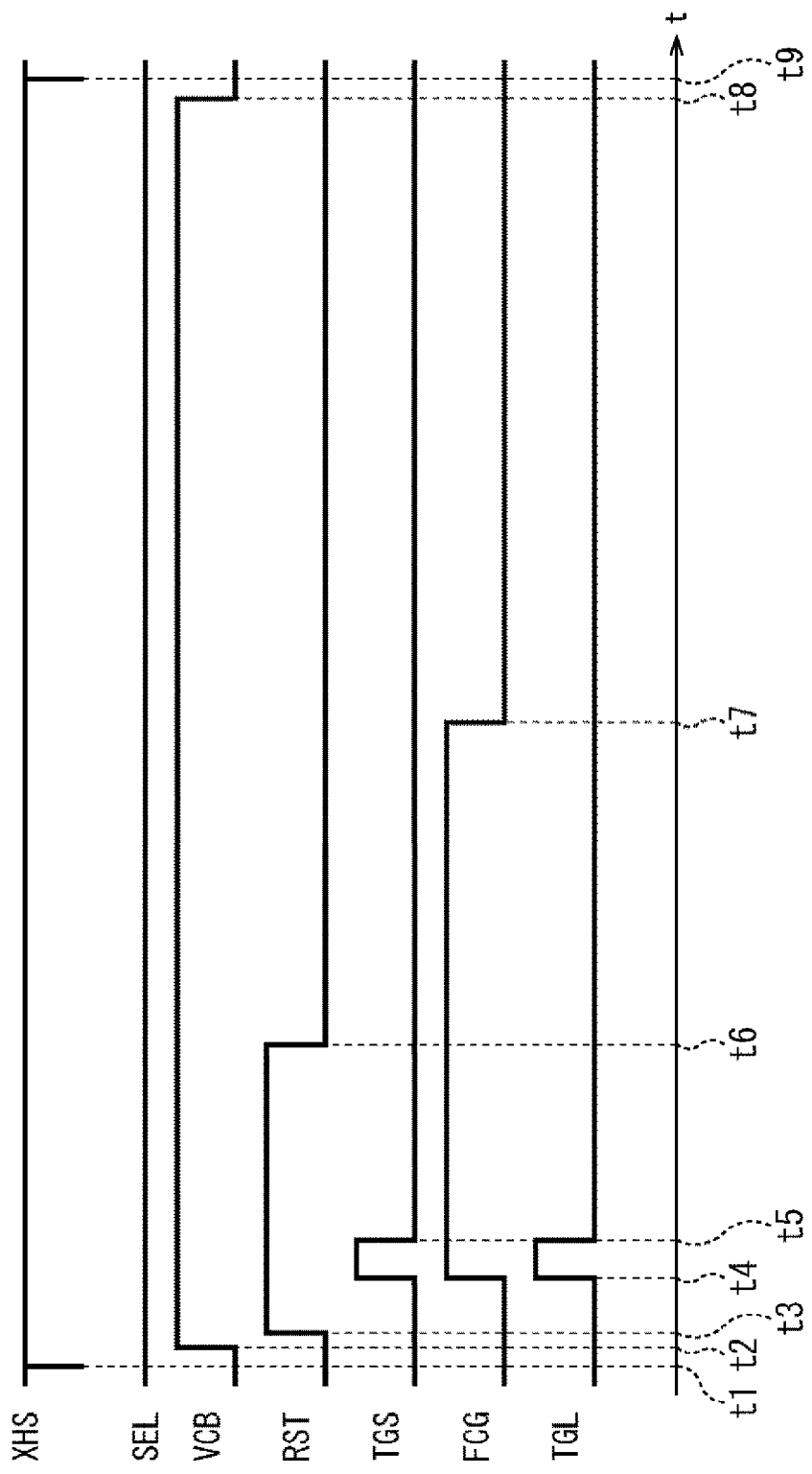
FIG. 9 is a timing chart that explains the action of the unit pixel (depicted in FIG. 8) at the start of exposure.
Figure 10:
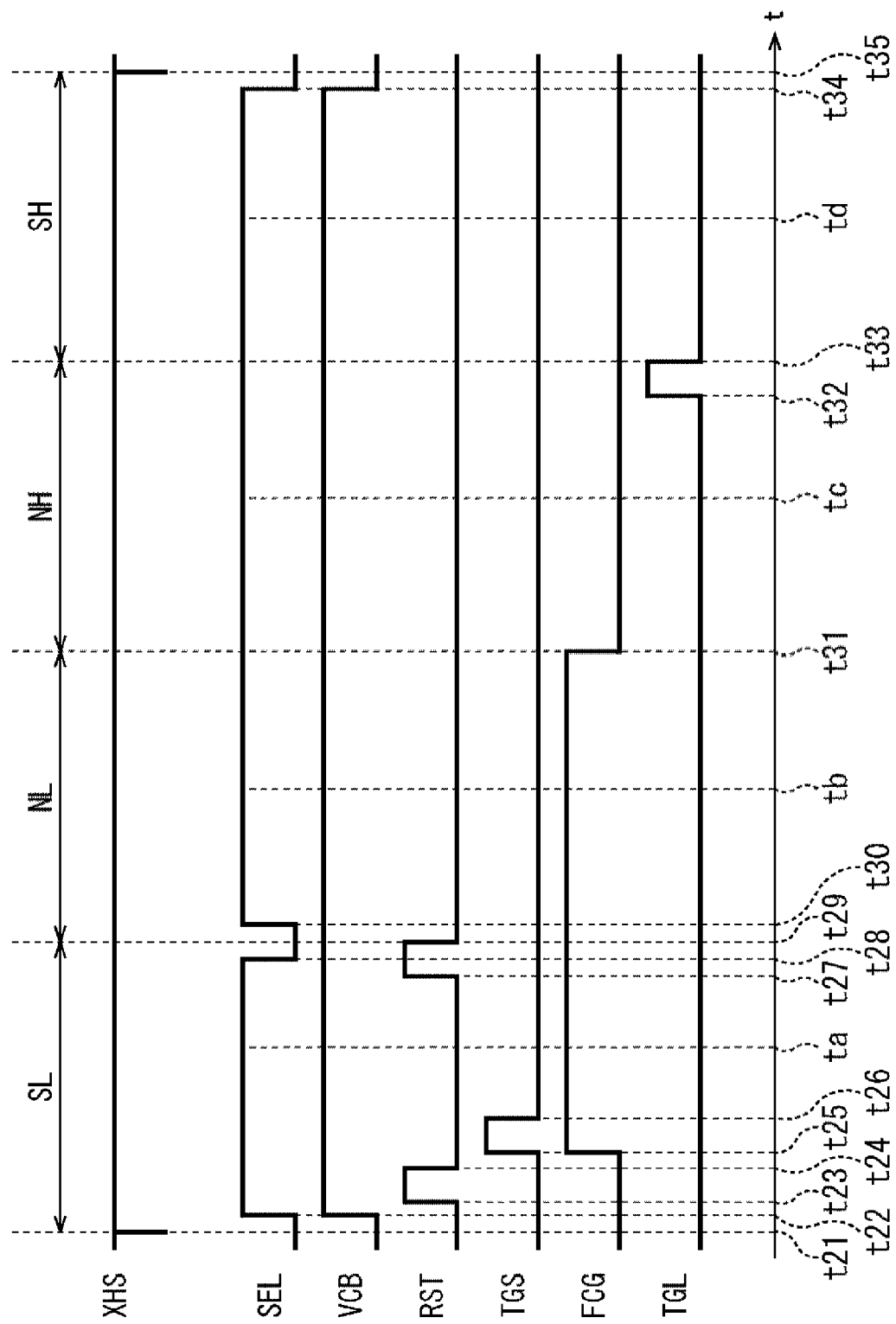
FIG. 10 is a timing chart that explains the action of the unit pixel (depicted in FIG. 8) at the time of read out.

In what follows, a second embodiment of the present technology will be described with reference to FIGS. 8 to 10.

{Circuit Structure of Unit Pixel 100C}

Figure 8:
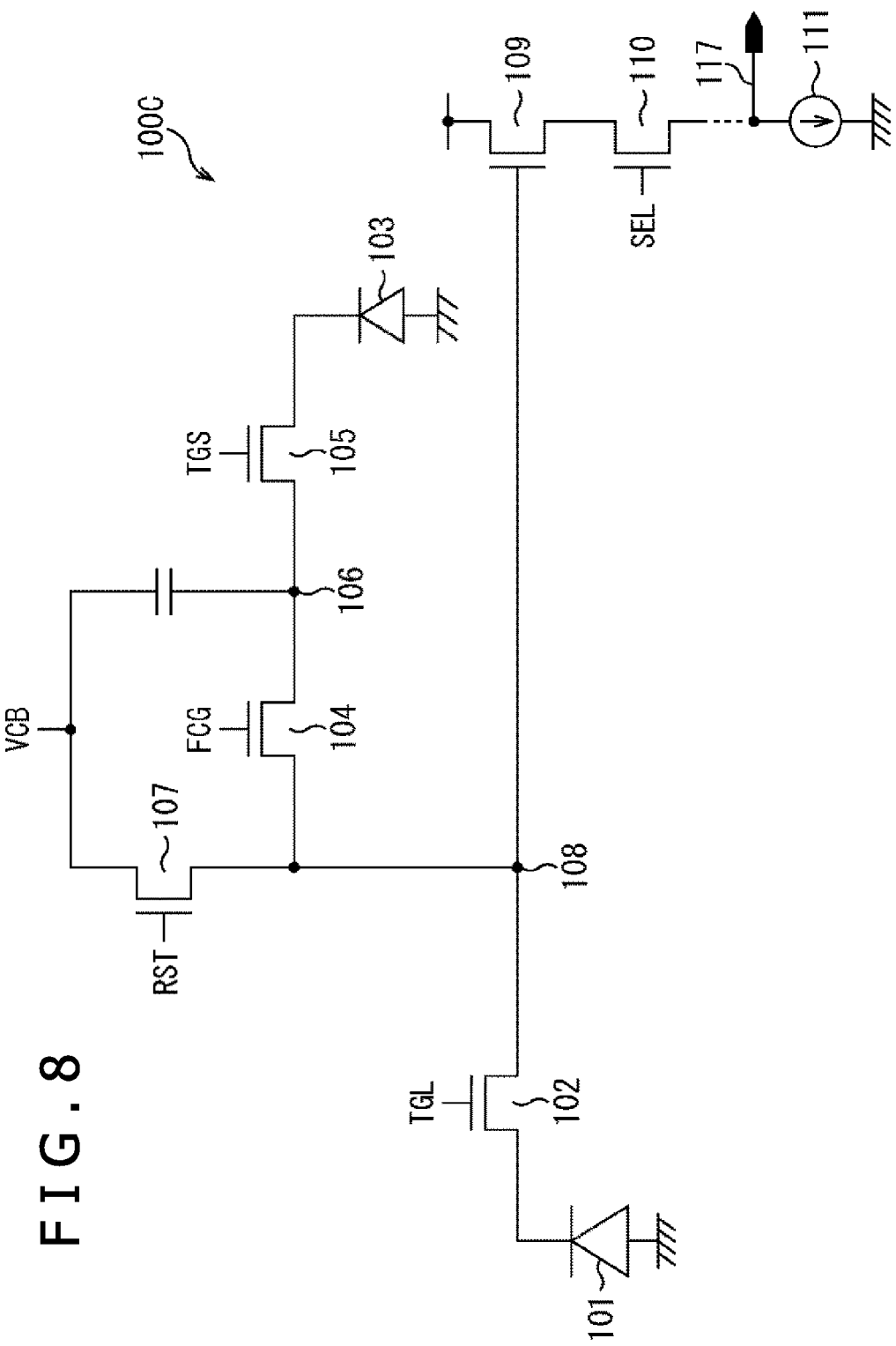
FIG. 8 is a circuit diagram depicting an example of a structure of a unit pixel according to a second embodiment of the present technology.

FIG. 8 is a circuit diagram illustrating an example of the structure of a unit pixel 100C which is arranged in the pixel array section 11 depicted in FIGS. 1 to 3. Incidentally, those parts in FIG. 8 corresponding to those parts in FIG. 4 are given identical signs, with their description omitted.

Comparison between the unit pixel 100C and the unit pixel 100A depicted in FIG. 4 reveals that the counter electrode of the charge storage section 106 and the reset gate section 107 are connected to a variable power source VCB in place of the power source voltage VDD. The power source voltage VCB of the variable power source VCB is set, for example, at a high-level voltage VH or a low-level voltage VL. For example, the voltage VH may be set at the same level as the power source voltage VDD and the voltage VL may be set at the ground level.

{Action of Unit Pixel 100C}

The action of the unit pixel 100C will be described with reference to the timing charts depicted in FIGS. 9 and 10.

{Action of Unit Pixel 100C that Takes Place at Start of Exposure}

The following is a description of how the unit pixel 100C acts at the start of exposure. The description refers to the timing chart depicted in FIG. 9. This process takes place for each pixel row or a plurality of pixel rows of the pixel array section 11 according to the prescribed scanning sequence. Incidentally, FIG. 9 depicts the timing charts for the horizontal synchronizing signal XHS, the drive signal SEL, the power source voltage VCB, and the drive signals RST, TGS, FCG, and TGL.

First, at the time t1, the horizontal synchronizing signal XHS is input so that the process of exposure starts for the unit pixel 100C.

Next, at the time t2, the power source voltage VCB changes from the voltage VL to the voltage VH.

Then, at the times t3 to t7, the actions at the times t2 to t6 depicted in FIG. 5 take place in the same way. At the time t8, the power source voltage VCB changes from the voltage VH to the voltage VL. Finally, at the time t9, the horizontal synchronizing signal XHS is input.

(Action of Unit Pixel 100C that Takes Place at Time of Read Out)

The action of the unit pixel 100C that takes place at the time of read out will be described with reference to the timing charts depicted in FIG. 10. This process takes place for each pixel row or a plurality of pixel rows of the pixel array section 11 according to the prescribed scanning sequence after a prescribed period of time that follows the process depicted in FIG. 9. Incidentally, FIG. 10 depicts the timing charts for the horizontal synchronizing signal XHS, the drive signal SEL, the power source voltage VCB, and the drive signals RST, TGS, FCG, and TGL.

First, at the time t21, the horizontal synchronizing signal XHS is input, so that the period of reading out the unit pixel 100C starts.

Next, at the time t22, the drive signal SEL turns on so that the selective transistor 110 turns on. As the result, the unit pixel 100C assumes the selected state. Moreover, the power source voltage VCB changes from the voltage VL to the voltage VH.

Then, at the times t23 to td, the actions at the times t23 to td depicted in FIG. 6 take place in the same way. Then, at the time t34, the selective signal SEL turns off so that the selective transistor 110 turns off. As the result, the unit pixel 100C assumes the unselected state, and the power source voltage VCB changes from the voltage VH to the voltage VL.

Next, at the time t35, the horizontal synchronizing signal XHS is input, and the period of reading out the pixel signal of the unit pixel 100C comes to an end.

In the unit pixel 100C, the power source voltage VCB is set at the voltage VL throughout the period in which charge is stored in the charge storage section 106 until the start of read out after the start of exposure. As the result, the electric field which is applied to the charge storage section 106 during the period in which charge is stored in the charge storage section 106 is relieved, and this leads to suppression of the dark current that occurs in the charge storage section 106.

4. Third Embodiment

In what follows, a third embodiment of the present technology will be described with reference to FIGS. 11 to 13.

{Circuit Structure of Unit Pixel 100D}

Figure 11:
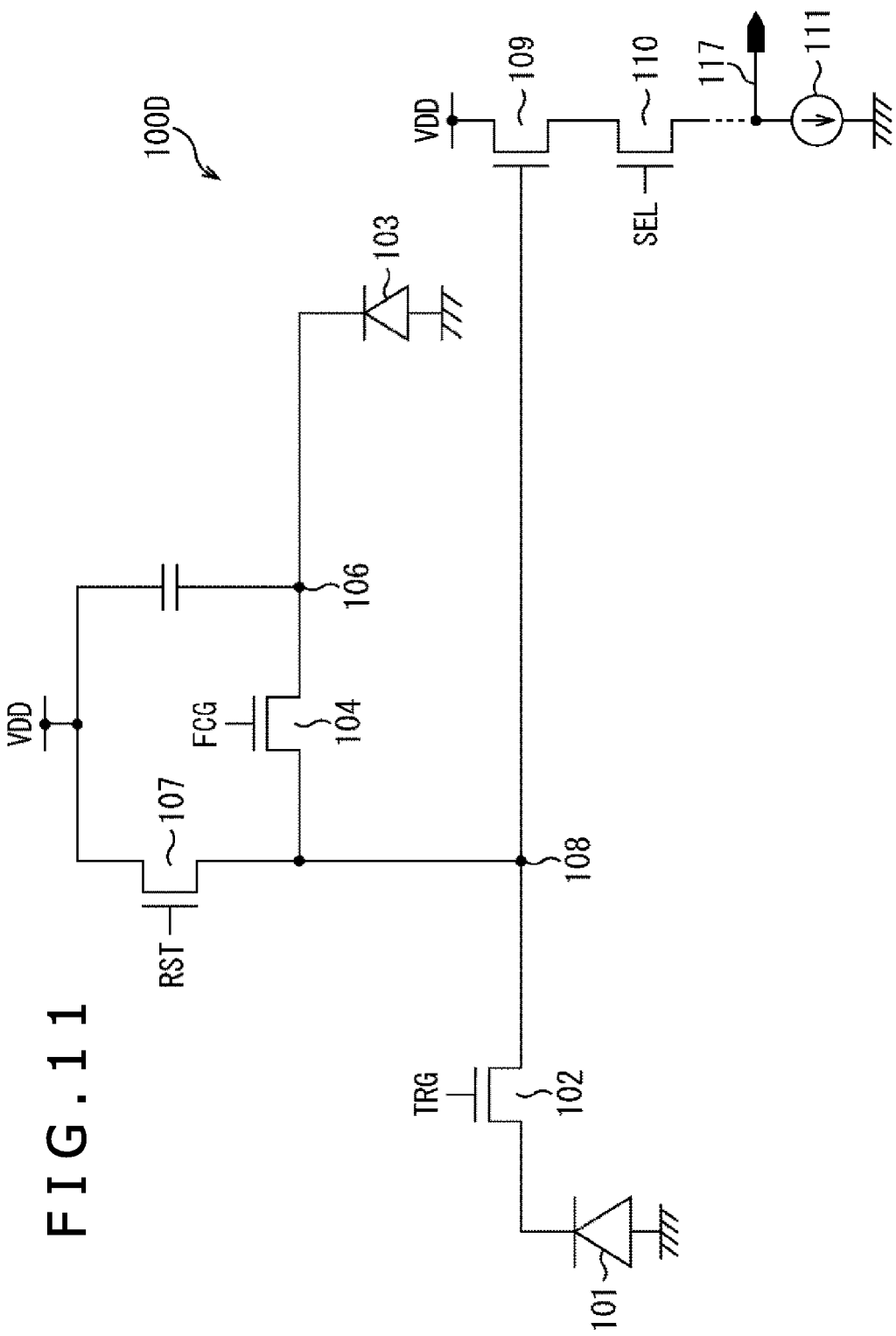
FIG. 11 is a circuit diagram depicting an example of a structure of a unit pixel according to a third embodiment of the present technology.
Figure 12:
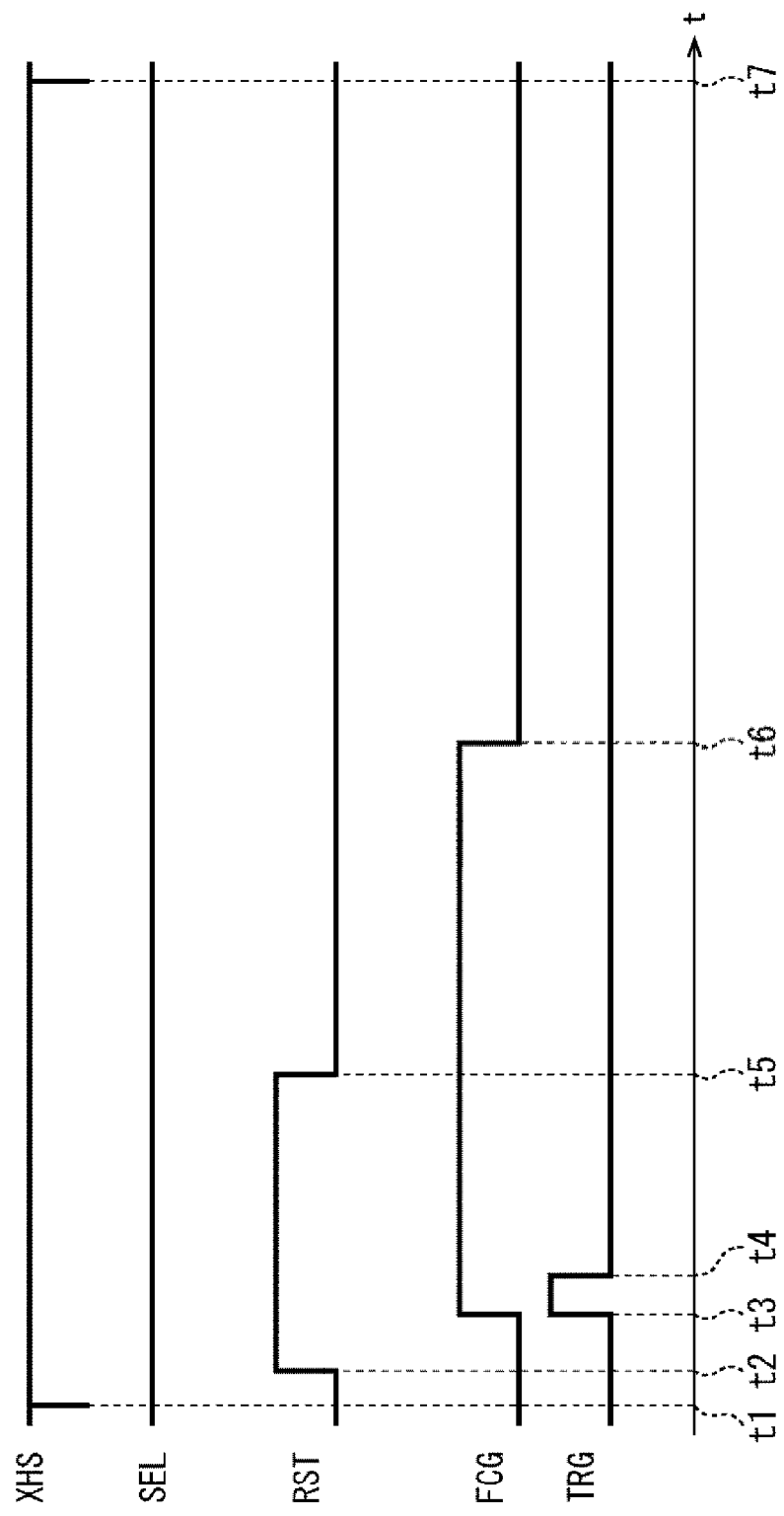
FIG. 12 is a timing chart that explains the action of the unit pixel (depicted in FIG. 11) at the start of exposure.

FIG. 11 is a circuit diagram illustrating an example of the structure of a unit pixel 100D which is arranged in the pixel array section 11 depicted in FIGS. 1 to 3. Incidentally, those parts in FIG. 11 corresponding to those parts in FIG. 4 are given identical signs, with their description omitted.

Comparison between the unit pixel 100D and the unit pixel 100A depicted in FIG. 4 reveals that the third transfer gate section 105 is omitted. In other words, the second photoelectric conversion section 103 is connected directly to the charge storage section 106 without passage through the third transfer gate section 105. As the result, the charge generated by the second photoelectric conversion section 103 is transferred to the charge storage section 106 and stored there.

Also, the drive signal TRG in place of the drive signal TGL is applied to the first transfer gate section 102, provided that the drive signal TGR is identical with the drive signal TGL.

{Action of Unit Pixel 100D}

The action of the unit pixel 100D will be described with reference to the timing charts depicted in FIGS. 12 and 13.

{Action of Unit Pixel 100D that Takes Place at Start of Exposure}

The following is a description of how the unit pixel 100D acts at the start of exposure. The description refers to the timing chart depicted in FIG. 12. This process takes place for each pixel row or a plurality of pixel rows of the pixel array section 11 according to the prescribed scanning sequence. Incidentally, FIG. 12 depicts the timing charts for the horizontal synchronizing signal XHS, and the drive signals SEL, RST, FCG, and TRG.

First, at the time t1, the horizontal synchronizing signal XHS is input so that the process of exposure starts for the unit pixel 100D.

Next, at the time t2, the drive signal RST turns on so that the reset gate section 107 turns on. As the result, the potential of the FD section 108 is reset to the level of the power source voltage VDD.

Next, at the time t3, the drive signals FCG and TRG turn on so that the first transfer gate section 102 and the second transfer gate section 104 turn on. As the result, the potential of the charge storage section 106 and the potential of the FD section 108 are combined together. Also, the charge stored in the first photoelectric conversion section 101 is transferred to the combined region through the first transfer gate section 102. Then, the combined region is reset.

Next, at the time t4, the drive signal TRG turns off so that the first transfer gate section 102 turns off. As the result, the first photoelectric conversion section 101 and the second photoelectric conversion section 103 start to store charges. Thus, the exposure period starts.

Next, at the time t5, the drive signal RST turns off so that the reset gate section 107 turns off.

Next, at the time t6, the drive signal FCG turns off so that the second transfer gate section 104 turns off. As the result, the charge storage section 106 starts to store the charge transferred from the second photoelectric conversion section 103.

Then, at the time t7, the horizontal synchronizing signal XHS is input.

(Action of Unit Pixel 100D that Takes Place at Time of Read Out)

Next, the action of the unit pixel 100D that takes place at the time of read out will be described with reference to the timing charts depicted in FIG. 13. This process takes place for each pixel row or a plurality of pixel rows of the pixel array section 11 according to the prescribed scanning sequence after a prescribed period of time that follows the process depicted in FIG. 12. Incidentally, FIG. 13 depicts the timing charts for the horizontal synchronizing signal XHS and the drive signals SEL, RST, FCG, and TRG.

First, at the time t21, the horizontal synchronizing signal XHS is input, so that the period of reading out the unit pixel 100D starts.

Next, at the time t22, the drive signal SEL turns on so that the selective transistor 110 turns on. As the result, the unit pixel 100D is selected.

Next, at the time t23, the drive signal RST turns on so that the reset gate section 107 turns on. As the result, the potential of the FD section 108 is reset to the level of the power source voltage VDD.

Next, at the time t24, the drive signal RST turns off so that the reset gate section 107 turns off.

Next, at the time t25, the drive signal FCG turns on so that the second transfer gate section 104 turns on. As the result, the potential of the charge storage section 106 is combined with the potential of the FD section 108, and the charge which has been generated during exposure period in the second photoelectric conversion section 103 and stored in the charge storage section 106 is stored in the combined regions.

At this time t25, the reading out of the pixel signal starts and the period of exposure comes to an end.

Then, at the times ta to tc, the same action as that which takes place at the times ta to tc depicted in FIG. 6 takes place.

Next, at the time t31, the drive signal TRG turns on so that the first transfer gate section 102 turns on. As the result, the charge which has been generated and stored during exposure period in the first photoelectric conversion section 101 is transferred to the FD section 108 through the first transfer gate section 102.

Next, at the time t32, the drive signal TRG turns off so that the first transfer gate section 102 turns off. As the result, the transfer of charge from the first photoelectric conversion section 101 to the FD section 108 comes to an end.

Finally, at the times td to t34, the same action as that which takes place at the times td to t35 depicted in FIG. 6 takes place, and then the period of reading out the pixel signal of the unit pixel 100D comes to an end.

Having no second transfer gate section 104, the unit pixel 100D permits its various elements to be arranged efficiently in its available area. For example, it is possible to increase the area of the light receiving surface of the first photoelectric conversion section 101, thereby improving the first photoelectric conversion section 101 in sensitivity.

5. Fourth Embodiment

In what follows, the fourth embodiment of the present technology will be described with reference to FIGS. 14 to 16.

{Circuit Structure of Unit Pixel 100E}

Figure 14:
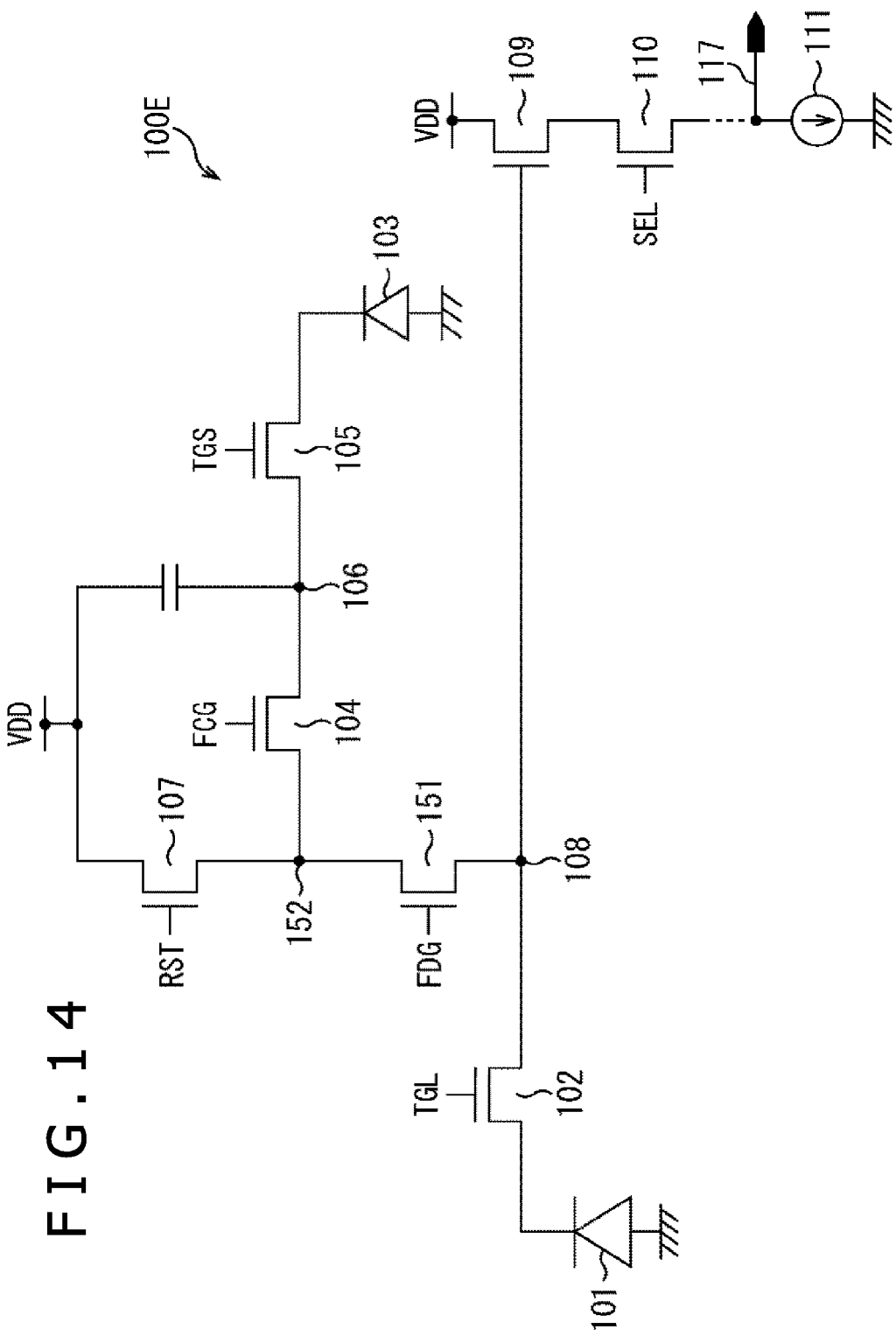
FIG. 14 is a circuit diagram depicting an example of a structure of a unit pixel according to a fourth embodiment of the present technology.
Figure 15:
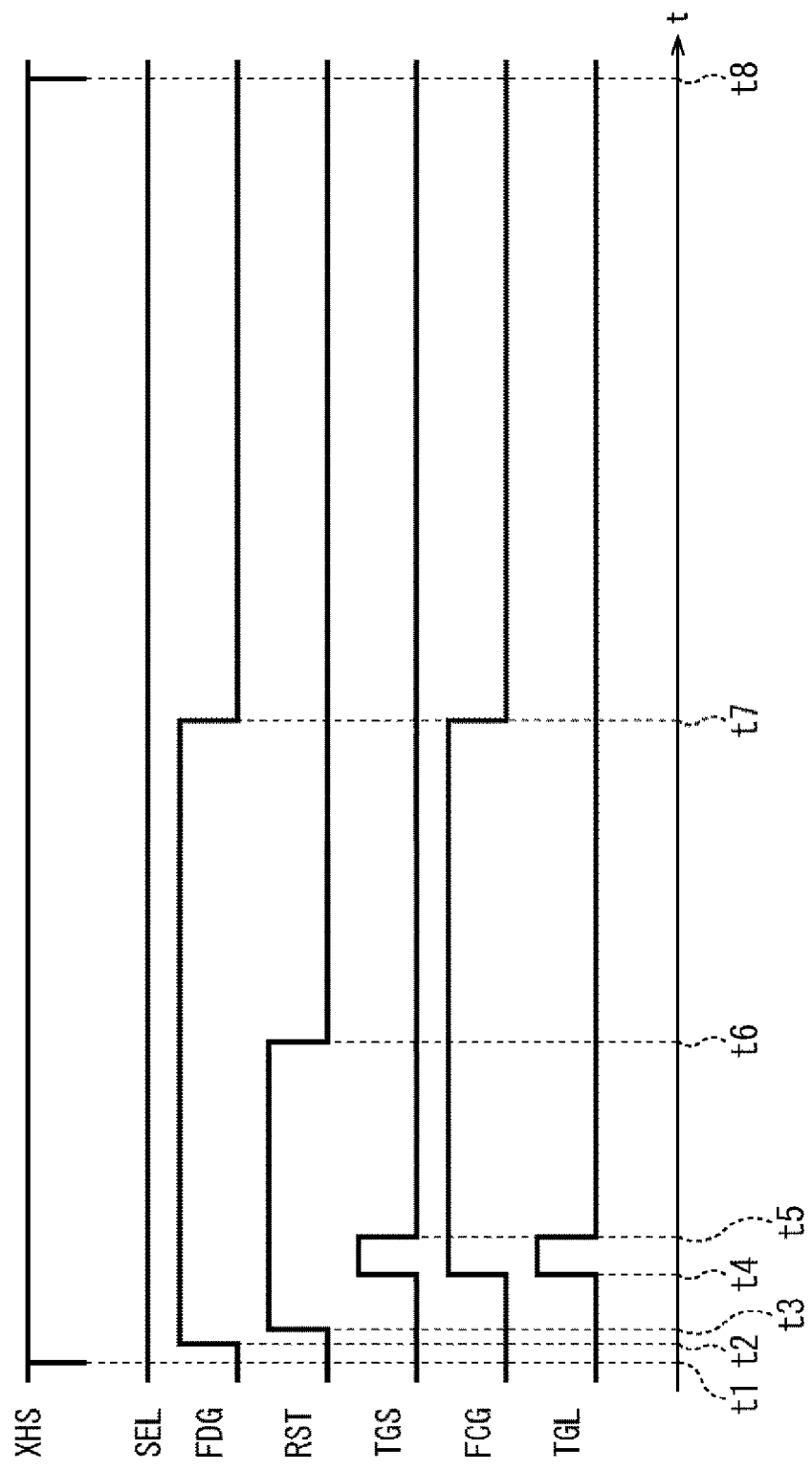
FIG. 15 is a timing chart that explains the action of the unit pixel (depicted in FIG. 14) at the start of exposure.

FIG. 14 is a circuit diagram illustrating an example of the structure of a unit pixel 100E which is arranged in the pixel array section 11 depicted in FIGS. 1 to 3. Incidentally, those parts in FIG. 14 corresponding to those parts in FIG. 4 are given identical signs, with their description omitted.

Comparison between the unit pixel 100E depicted in FIG. 14 and the unit pixel 100A depicted in FIG. 4 reveals that a fourth transfer gate section 151 is additionally provided in the unit pixel 100E. The fourth transfer gate section 151 is connected between the second transfer gate section 104 and the reset gate section 107, and the FD section 108. The fourth transfer gate section 151 has the drive signal FDG applied to its gate electrode. When the drive signal FDG becomes active, the fourth transfer gate section 151 becomes conductive, so that the potential at a node 152 between the second transfer gate section 104 and reset gate section 107, and the fourth transfer gate section 151, and the potential at the FD section 108 are combined together.

{Action of Unit Pixel 100E}

The action of the unit pixel 100E will be described with reference to the timing charts depicted in FIGS. 15 and 16.

{Action of Unit Pixel 100E that Takes Place at Start of Exposure}

The following is a description of how the unit pixel 100E acts at the start of exposure. The description refers to the timing chart depicted in FIG. 15. This process is performed for each pixel row or a plurality of pixel rows of the pixel array section 11 according to the prescribed scanning sequence, for example. Incidentally, FIG. 15 depicts the timing charts for the horizontal synchronizing signal XHS, and the drive signals SEL, FDG, RST, TGS, FCG, and TGL.

First, at the time t1, the horizontal synchronizing signal XHS is input so that the process of exposure starts for the unit pixel 100E.

Next, at the time t2, the drive signal FDG turns on so that the fourth transfer gate section 151 turns on.

Next, at the time t3, the drive signal RST turns on so that the reset gate section 107 turns on. As the result, the potential at the FD section 108 and the node 152 is reset to the level of the power source voltage VDD.

Next, at the time t4, the drive signals TGL, FCG, and TGS turn on so that the first transfer gate section 102, the second transfer gate section 104, and the third transfer gate section 105 turn on. As the result, the potentials at the charge storage section 106, the FD section 108, and the node 152 are combined together. Also, the charge stored in the first photoelectric conversion section 101 is transferred to the combined region through the first transfer gate section 102, and the charge stored in the second photoelectric conversion section 103 is transferred to the combined region through the third transfer gate section 105. The combined region is then reset.

Next, at the time t5, the drive signals TGL and TGS turn off so that the first transfer gate section 102 and the third transfer gate section 105 turn off. As the result, the first photoelectric conversion section 101 and the second photoelectric conversion section 103 start to store charges. Thus, the exposure period starts.

Next, at the time t6, the drive signal RST turns off so that the reset gate section 107 turns off.

Next, at the time t7, the drive signals FCG and FDG turn off so that the second transfer gate section 104 and the fourth transfer gate section 151 turn off. As the result, the charge storage section 106 starts to store the charge which has overflown from the second photoelectric conversion section 103 and has been transferred through the overflow path of the third transfer gate section 105.

Then, at the time t8, the horizontal synchronizing signal XHS is input.

(Action of Unit Pixel 100E that Takes Place at Time of Read Out)

The action of the unit pixel 100E that takes place at the time of reading out pixel signals will be described with reference to the timing charts depicted in FIG. 16. This process is performed for each pixel row or a plurality of pixel rows of the pixel array section 11 according to the prescribed scanning sequence after a prescribed period of time that follows the process depicted in FIG. 15, for example. Incidentally, FIG. 16 depicts the timing charts for the horizontal synchronizing signal XHS and the drive signals SEL, FDG, RST, TGS, FCG, and TGL.

First, at the time t21, the horizontal synchronizing signal XHS is input, so that the period of reading out the unit pixel 100E starts.

Next, at the time t22, the drive signal SEL turns on so that the selective transistor 110 turns on. As the result, the unit pixel 100E is selected. Then, the drive signal FDG turns on so that the fourth transfer gate section 151 turns on. As the result, the potential at the FD section 108 and the potential at the node 152 are combined together.

Next, at the times t23 to tb, the same action as that which takes place at the times t23 to tb depicted in FIG. 6 takes place. At the time t31, the drive signals FCG and FDG turn off and the second transfer gate section 104 and the fourth transfer gate section 151 turn off.

Next, at the times tc to t35, the same action as that which takes place at the times tc to t35 depicted in FIG. 6 takes place. Then, the period of reading out the unit pixel 100E comes to an end.

Figure 16:
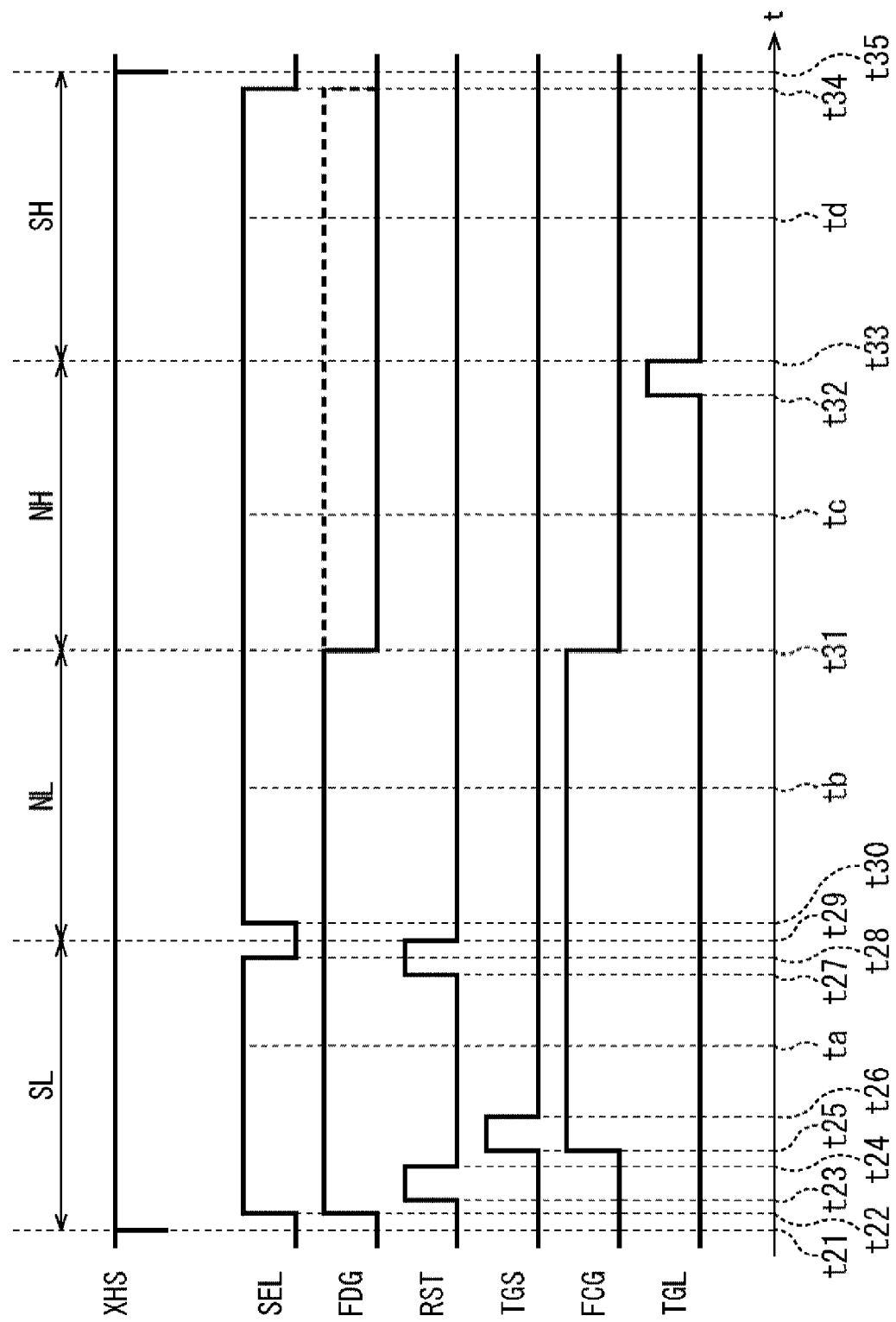
FIG. 16 is a timing chart that explains the action of the unit pixel (depicted in FIG. 14) at the time of read out.

There may be an alternative way as depicted with a dotted line in FIG. 16. It is intended to turn off the drive signal FDG at the time t34 instead of turning off the drive signal FDG at the time t31.

In the case where the drive signal FDG turns off at the time t31, the high-sensitivity data signal SH and the high-sensitivity reset signal NH are read out without the potential at the FD section 108 and the potential at the node 152 being combined together. As the result, the capacity at the time of reading out the high-sensitivity data signal SH and the high-sensitivity reset signal NH is limited only to the capacity of the FD section 108.

On the other hand, in the case where the drive signal FDG does not turn off at the time t31, the high-sensitivity data signal SH and the high-sensitivity reset signal NH are read out, with the potential at the FD section 108 combined with the potential at the node 152 through the fourth transfer gate section 151. As the result, the capacity at the time of reading out the high-sensitivity data signal SH and the high-sensitivity reset signal NH becomes equal to the sum of the capacity of the FD section 108, the capacity of the fourth transfer gate section 151, and the capacity of the node 152.

Thus, the efficiency of conversion at the time of reading out the high-sensitivity data signal SH and the high-sensitivity reset signal NH can be adjusted by controlling the turn on/off of the drive signal FDG. For example, turning off the drive signal FDG in the case of low illuminance causes the conversion efficiency to increase, thereby improving the SN ratio of the high-sensitivity data signal. Also, for example, turning off the drive signal FDG at the time of high illuminance causes the conversion efficiency to decrease, thereby suppressing decrease in the dynamic range of the high-sensitivity data signal.

Incidentally, turning on/off the drive signal FDG may be controlled for individual frames or individual rows. For example, images may be acquired by turning on and off the drive signal FDG alternately for each unit row of the color matrix, and the thus obtained images may be complemented and synthesized to expand the dynamic range of the high-sensitivity data signal despite the resolution being sacrificed.

6. Fifth Embodiment

In what follows, the fifth embodiment of the present technology will be described with reference to FIGS. 17 to 19.

{Circuit Structure of Unit Pixel 100F}

Figure 17:
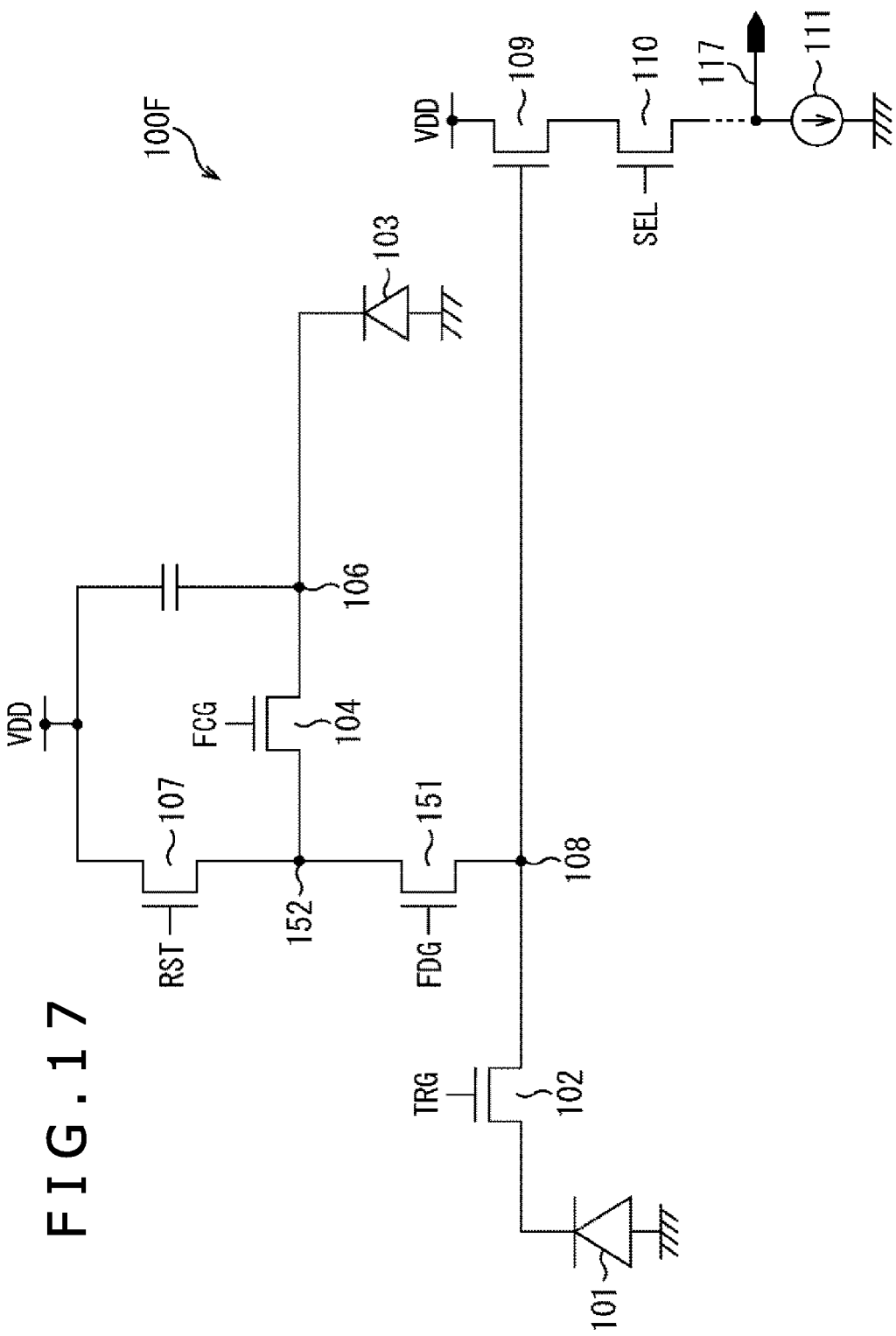
FIG. 17 is a circuit diagram depicting an example of a structure of a unit pixel according to a fifth embodiment of the present technology.
Figure 18:
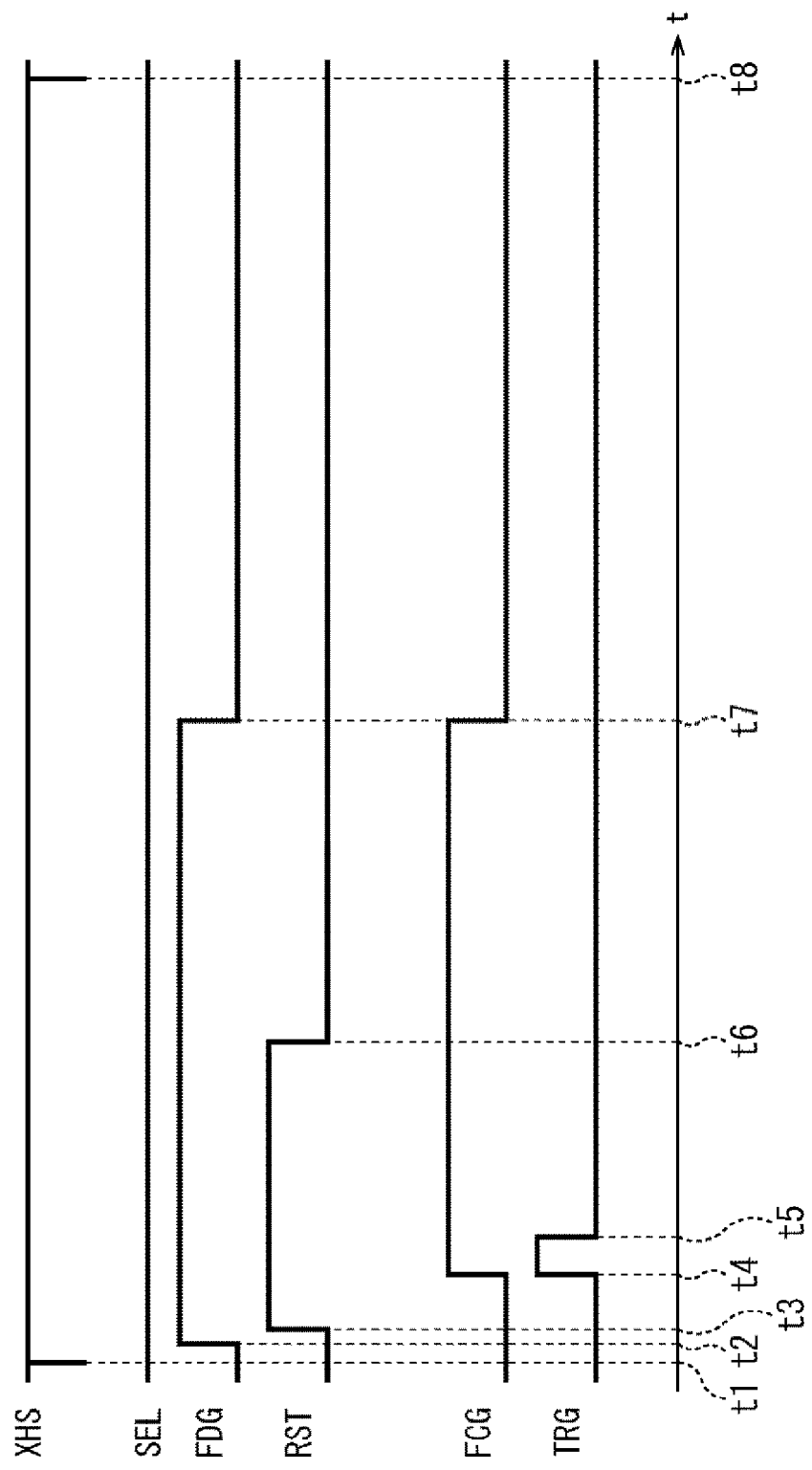
FIG. 18 is a timing chart that explains the action of the unit pixel (depicted in FIG. 17) at the start of exposure.

FIG. 17 is a circuit diagram illustrating an example of the structure of a unit pixel 100F which is arranged in the pixel array section 11 depicted in FIGS. 1 to 3. Incidentally, those parts in FIG. 17 corresponding to those parts in FIG. 14 are given identical signs, with their description omitted.

Comparison between the unit pixel 100F and the unit pixel 100E depicted in FIG. 14 reveals that the third transfer gate section 105 is absent in the unit pixel 100F. In other words, the second photoelectric conversion section 103 is connected directly to the charge storage section 106 without the third transfer gate section 105 being connected. Therefore, the unit pixel 100F is constructed such that the fourth transfer gate section 151 is added to the unit pixel 100D depicted in FIG. 11.

{Action of Unit Pixel 100F}

The action of the unit pixel 100F will be described with reference to the timing charts depicted in FIGS. 18 and 19.

{Action of Unit Pixel 100F that Takes Place at Start of Exposure}

The following is a description of how the unit pixel 100F acts at the start of exposure. The description refers to the timing chart depicted in FIG. 18. This process is performed for each pixel row or a plurality of pixel rows of the pixel array section 11 according to the prescribed scanning sequence. Incidentally, FIG. 18 depicts the timing charts for the horizontal synchronizing signal XHS, and the drive signals SEL, FDG, RST, FCG, and TRG.

First, at the time t1, the horizontal synchronizing signal XHS is input so that the process of exposure starts for the unit pixel 100F.

Next, at the time t2, the drive signal FDG turns on so that the fourth transfer gate section 151 turns on.

Next, at the time t3, the drive signal RST turns on so that the reset gate section 107 turns on. As the result, the potential at the FD section 108 and the node 152 is reset to the level of the power source voltage VDD.

Next, at the time t4, the drive signals TRG and FCG turn on so that the first transfer gate section 102 and the second transfer gate section 104 turn on. As the result, the potentials at the charge storage section 106, the FD section 108, and the node 152 are combined together. Also, the charge stored in the first photoelectric conversion section 101 is transferred to the combined region through the first transfer gate section 102. The combined region is then reset.

Next, at the time t5, the drive signal TRG turns off so that the first transfer gate section 102 turns off. As the result, the first photoelectric conversion section 101 and the second photoelectric conversion section 103 start to store charges. Thus, the exposure period starts.

Next, at the time t6, the drive signal RST turns off so that the reset gate section 107 turns off.

Next, at the time t7, the drive signals FCG and FDG turn off so that the second transfer gate section 104 and the fourth transfer gate section 151 turn off. As the result, the charge storage section 106 starts to store the charge which has been transferred from the second photoelectric conversion section 103.

Then, at the time t8, the horizontal synchronizing signal XHS is input.

(Action of Unit Pixel 100F that Takes Place at Time of Read Out)

The action of the unit pixel 100F that takes place at the time of reading out pixel signals will be described with reference to the timing charts depicted in FIG. 19. This process is performed for each pixel row or a plurality of pixel rows of the pixel array section 11 according to the prescribed scanning sequence after a prescribed period of time that follows the process depicted in FIG. 18, for example. Incidentally, FIG. 19 depicts the timing charts for the horizontal synchronizing signal XHS and the drive signals SEL, FDG, RST, FCG, and TRG.

First, at the time t21, the horizontal synchronizing signal XHS is input, so that the period of reading out the unit pixel 100F starts.

Next, at the time t22, the drive signal SEL turns on so that the selective transistor 110 turns on. As the result, the unit pixel 100F is selected. Also, the drive signal FDG turns on so that the fourth transfer gate section 151 turns on. As the result, the potential at the FD section 108 and the potential at the node 152 are combined together.

Figure 13:
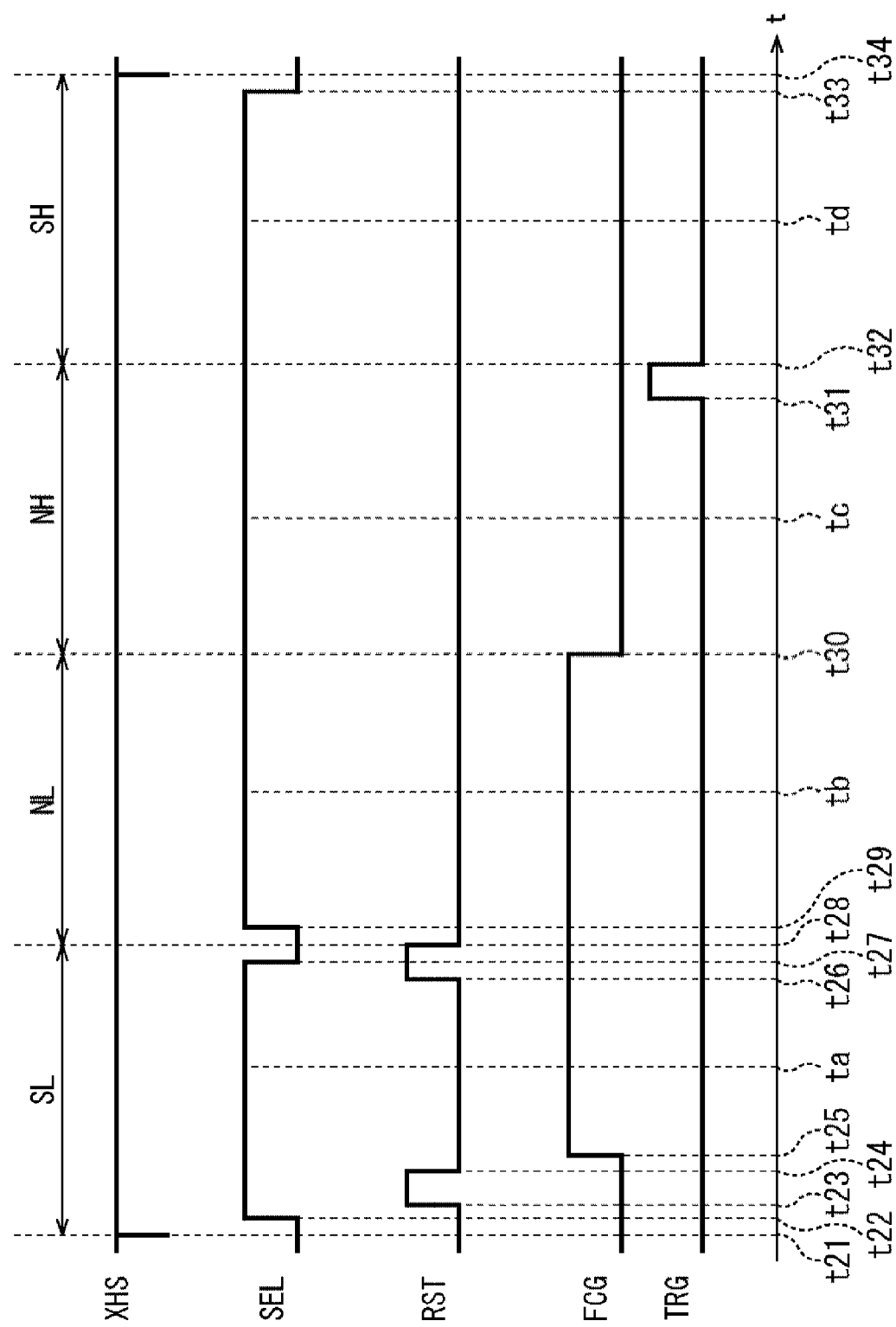
FIG. 13 is a timing chart that explains the action of the unit pixel (depicted in FIG. 11) at the time of read out.

Next, at the times t23 to tb, the same action as that which takes place at the times t23 to tb depicted in FIG. 13 takes place.

Next, at the time t30, the drive signals FCG and FDG turn off and the second transfer gate section 104 and the fourth transfer gate section 151 turn off.

Next, at the times tc to t34, the same action as that which takes place at the times tc to t34 depicted in FIG. 13 takes place. Then, the period of reading out the unit pixel 100F comes to an end.

Figure 19:
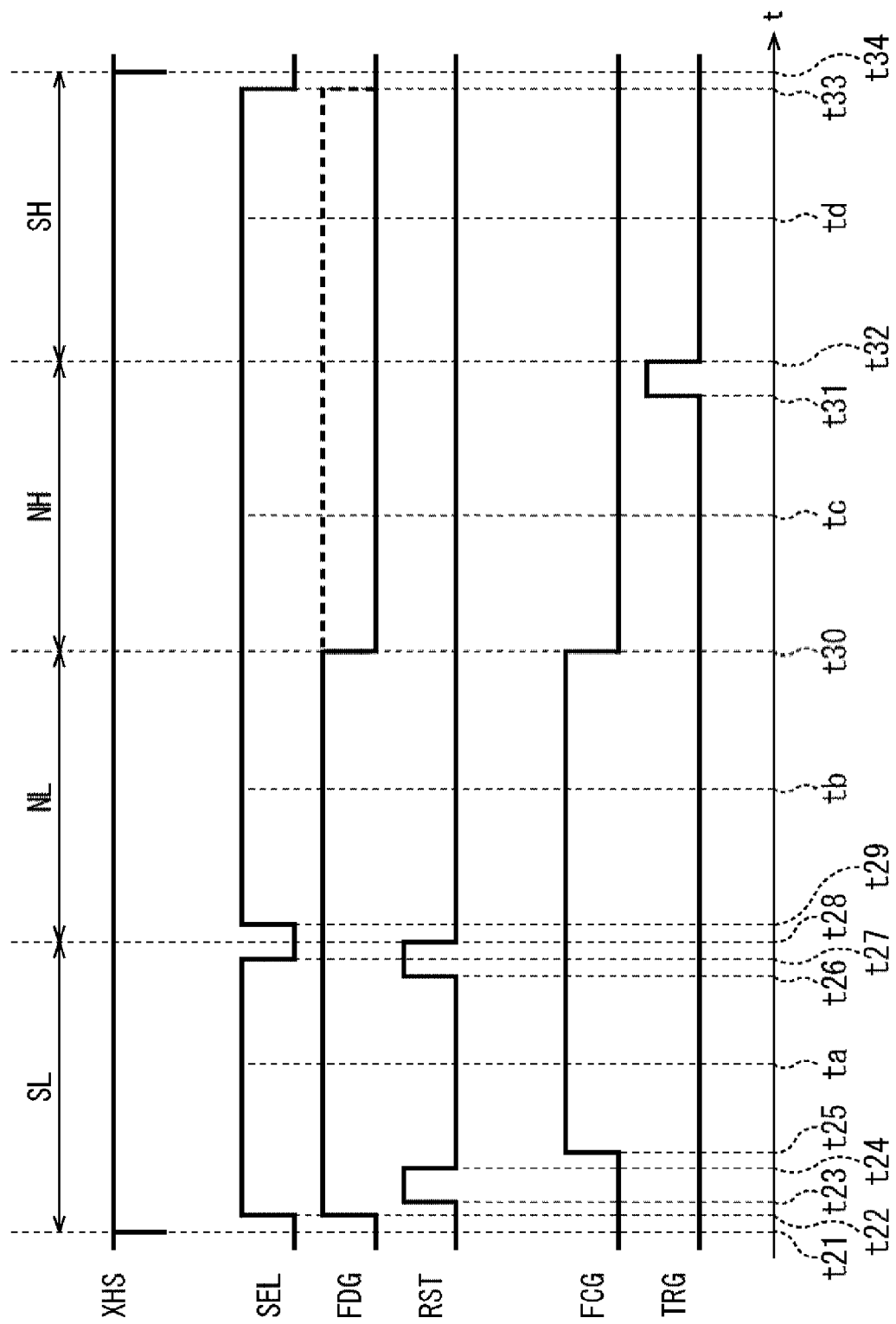
FIG. 19 is a timing chart that explains the action of the unit pixel (depicted in FIG. 17) at the time of read out.

There may be an alternative way as depicted with a dotted line in FIG. 19. It is intended to turn off the drive signal FDG at the time t33 instead of turning off the drive signal FDG at the time t30. As the result, the unit pixel 100F can adjust, as with the unit pixel 100E depicted in FIG. 14, its conversion efficiency at the time of reading out the high-sensitivity data signal SH and the high-sensitivity reset signal NH.

7. Description of Noise Removal Processing and Arithmetic Processing

The unit pixels 100A to 100F mentioned above output signals to the vertical signal line 17 sequentially in the order of the low-sensitivity data signal SL, the low-sensitivity reset signal NL, the high-sensitivity reset signal NH, and the high-sensitivity data signal SH. In the subsequent signal processing sections, such as the column processing section 13 and the signal processing section 18 depicted in FIGS. 1 to 3, the prescribed noise removal processing and signal processing are performed on the low-sensitivity data signal SL, the low-sensitivity reset signal NL, the high-sensitivity reset signal NH, and the high-sensitivity data signal SH. The following is a description of the noise removal processing by the subsequent column processing section 13 and the arithmetic processing by the subsequent signal processing section 18.

{Noise Removal Processing}
The description starts with the noise removal processing by the column processing section 13.

Example 1 of Noise Removal Processing

Example 1 of the noise removal processing is given first.
First, the column processing section 13 acquires the difference between the low-sensitivity data signal SL and the low-sensitivity reset signal NL, thereby producing a low-sensitivity difference signal SNL. This means that "Low-sensitivity difference signal SNL"="Low-sensitivity data signal SL"-"Low-sensitivity reset signal NL."

Next, the column processing section 13 acquires the difference between the high-sensitivity data signal SH and the high-sensitivity reset signal NH, thereby producing a high-sensitivity difference signal SNH. This means that "High-sensitivity difference signal SNH"="High-sensitivity data signal SH"-"High-sensitivity reset signal NH."

In this manner, in example 1, for the low-sensitivity signals SL and NL, the DDS processing is performed in which fixed-pattern noise inherent in the pixel, such as fluctuation of threshold values of amplifying transistors in the pixel, is removed but reset noise is not removed. For the high-sensitivity signals SH and NH, the CDS processing is performed in which fixed-pattern noise inherent in the pixel, such as fluctuation of threshold values of amplifying transistors in the pixel, and reset noise are removed.

The processing explained above as example 1 offers an advantage of simplifying the circuit structure and reduce production cost because it is an arithmetic processing which does not need any frame memory.

Example 2 of Noise Removal Processing

Example 2 of the noise removal processing is described below.

Example 2 employs the information of the preceding frame and hence it needs memory means such as a frame memory. Therefore, the arithmetic processing in example 2 employs the data storage section 19 as the memory means in the signal processing section 18 or employs the frame memory in the external DSP circuit, for example.

To be more specific, the column processing section 13 first acquires the difference between the low-sensitivity data signal SL and the low-sensitivity reset signal NL in the preceding frame, thereby producing the low-sensitivity difference signal SNL. This means that "Low-sensitivity difference signal SNL"="Low-sensitivity data signal SL"-"Low-sensitivity reset signal NL."

Next, the column processing section 13 acquires the difference between the high-sensitivity data signal SH and the high-sensitivity reset signal NH, thereby producing the high-sensitivity difference signal SNH. This means that "High-sensitivity difference signal SNH"="High-sensitivity data signal SH"-"High-sensitivity reset signal NH."

In this manner, in example 2, also for the low-sensitivity signals SL and NL, the CDS processing is performed in which fixed-pattern noise inherent in the pixel, such as fluctuation of threshold values of amplifying transistors in the pixel, and reset noise are removed. Thus, it offers an advantage of largely suppressing reset noise compared to example 1 although it requires memory means such as a frame memory.

{Arithmetic Processing of Pixel Signals}
The following is a description of the arithmetic processing of pixel signals by the signal processing section 18 in the first to third embodiments mentioned above.

Example 1 of Arithmetic Processing of Pixel Signals

The following is a description of example 1 of the arithmetic processing of pixel signals.

First, when the low-sensitivity difference signal SNL falls within a prescribed range, the signal processing section 18 calculates the gain in terms of the ratio between the low-sensitivity difference signal SNL and the high-sensitivity difference signal SNH, thereby producing a gain table. This process is performed for each pixel, for each group of pixels, for each color, for each specific pixel in the common pixel units, or equally for all pixels. Then, the signal processing section 18 calculate the product of the low-sensitivity difference signal SNL and the gain table, and this product is used to correct the low-sensitivity difference signal SNL.

If the gain is defined as G and the corrected value of the low-sensitivity difference signal SNL (hereinafter referred to as corrected low-sensitivity difference signal) as SNL', then the gain G and the corrected low-sensitivity difference signal SNL' can be expressed by the following formulas (1) and (2).

$$G=SNH/SHL=(Cfd+Cfc)/Cfd \quad (1)$$

$$SNL'=G \times SNL \quad (2)$$

Here, Cfd denotes the capacity value of the FD section 108 and Cfc denotes the capacity value of the charge storage section 106. Consequently, the gain G is equivalent to the capacity ratio.

Figure 20:
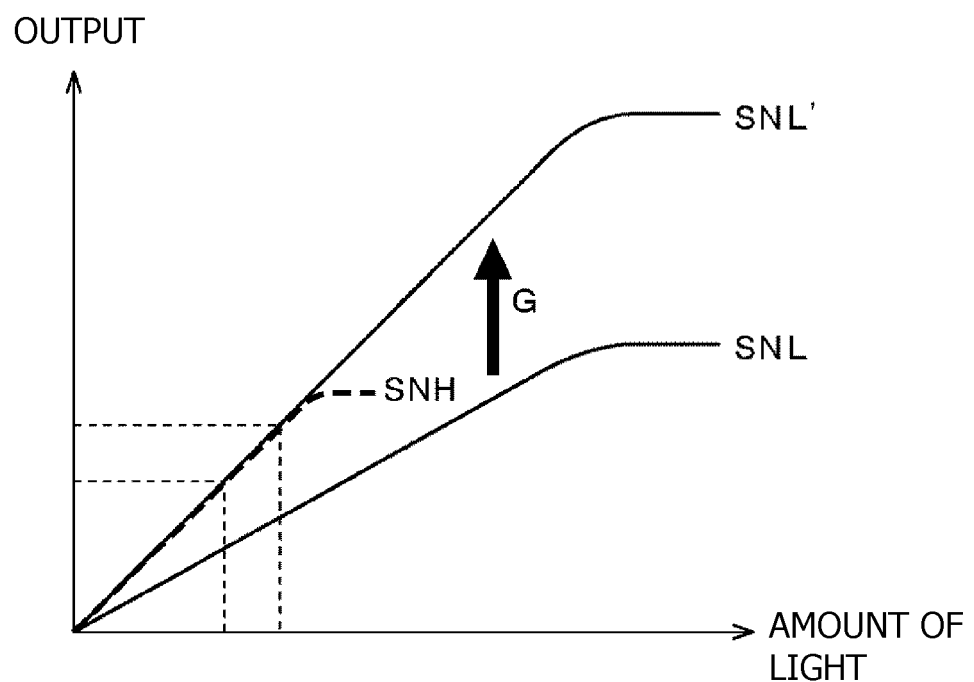
FIG. 20 is a characteristic curve (part 1) for the relation between the amount of incident light and the output. This figure is intended to explain a signal processing.

FIG. 20 depicts the relation between the amount of incident light and each of the low-sensitivity difference signal SNL, the high-sensitivity difference signal SNH, and the corrected low-sensitivity difference signal SNL'.

Figure 21:
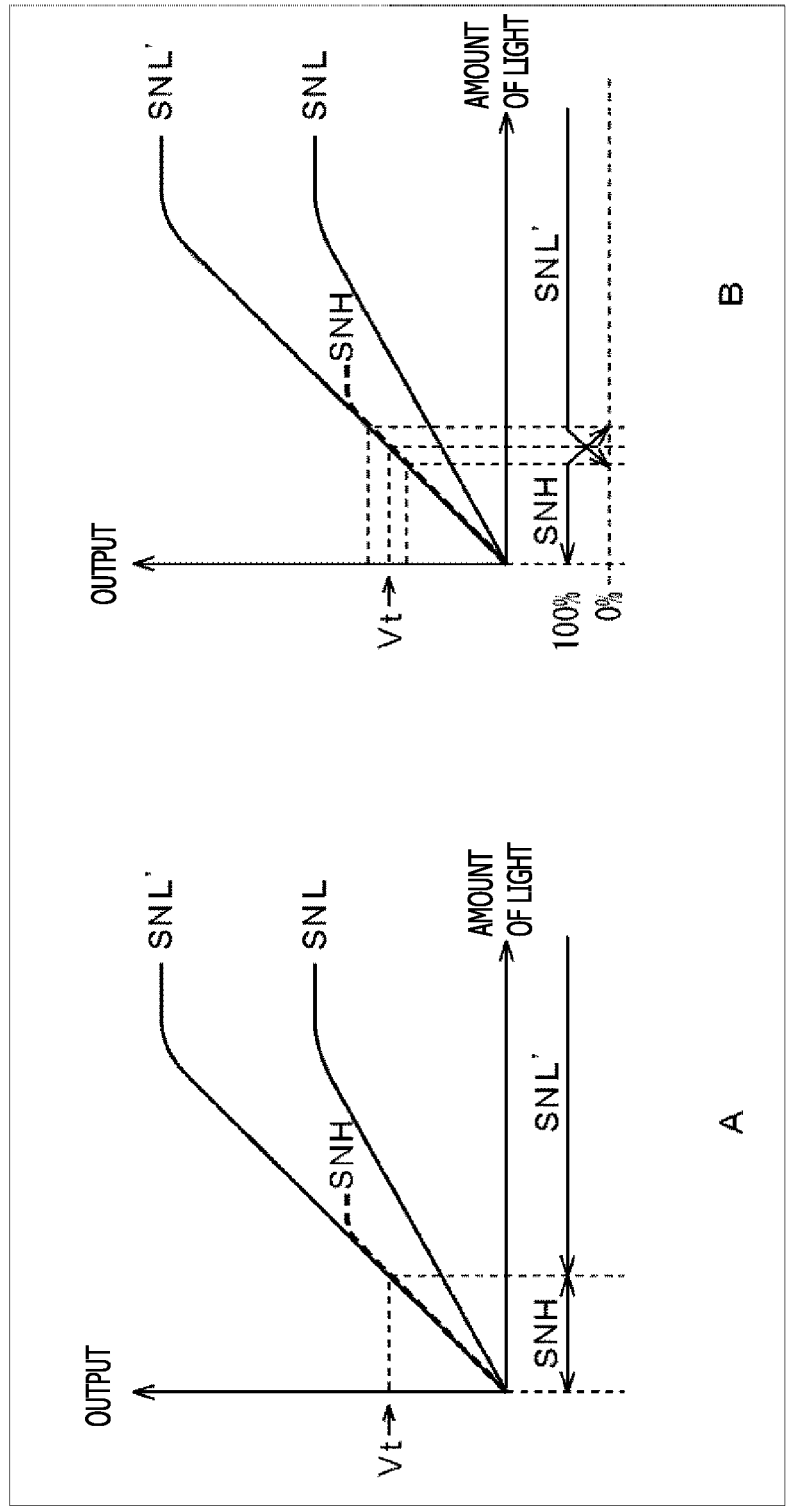
FIG. 21 is a characteristic curve (part 2) for the relation between the amount of incident light and the output. This figure is intended to explain the signal processing.

Next, as depicted in A of FIG. 21, the signal processing section 18 employs a prescribed threshold value Vt determined in advance. In terms of optical response characteristics, the threshold value Vt is determined in advance in the region where the high-sensitivity difference signal SNH is not yet saturated and the optical response characteristics are linear.

Then, the signal processing section 18 outputs the high-sensitivity difference signal SNH as a pixel signal SN of the pixel being processed so long as the high-sensitivity difference signal SNH does not exceeds the prescribed threshold value Vt. In other words, "Pixel signal SN=High-sensitivity difference signal SNH" holds in the case of "SNH<Vt."

On the other hand, in the case where the high-sensitivity difference signal SNH exceeds the prescribed threshold value Vt, the signal processing section 18 outputs the corrected low-sensitivity difference signal SNL' of the low-sensitivity difference signal SNL as the pixel signal SN of the pixel being processed. In other words, in the case of Vt≤SNH, "Pixel signal SN=Corrected low-sensitivity difference signal SNL'" holds.

Example 2 of Arithmetic Processing of Pixel Signals

The following is a description of example 2 of the arithmetic processing of pixel signals.

To be more specific, as depicted in B of FIG. 21, the signal processing section 18 synthesizes the corrected low-sensitivity difference signal SNL' and the high-sensitivity difference signal SNH at a predetermined ratio, with the high-sensitivity difference signal SNH confined in a prescribed range, and outputs the synthesized signal as the pixel signal SN.

For example, the signal processing section 18 changes stepwise the ratio of synthesizing the corrected low-sensitivity difference signal SNL' and the high-sensitivity difference signal SNH as described below within a range measured according to the prescribed threshold value Vt as the standard. As mentioned above, in terms of optical response characteristics, the prescribed threshold value Vt is a value determined in advance in the region where the high-sensitivity difference signal SNH is not yet saturated and the optical response characteristics are linear.

In the case of SNH<Vt×0.90, SN=SNH.

In the case of Vt×0.90≤SNH<Vt×0.94, SN=0.9×SNH+ 0.1×SNL'.

In the case of Vt×0.94≤SNH<Vt×0.98, SN=0.7×SNH+ 0.3×SNL'.

In the case of Vt×0.98≤SNH<Vt×1.02, SN=0.5×SNH+ 0.5×SNL'.

In the case of Vt×1.02≤SNH<Vt×1.06, SN=0.3×SNH+ 0.7×SNL'.

In the case of Vt×1.06≤SNH<Vt×1.10, SN=0.1×SNH+ 0.9×SNL'.

In the case of Vt×1.10≤SNH, SN=SNL'.

Incidentally, the fourth and fifth embodiments mentioned above are characterized in that the high-sensitivity data signal SH and the high-sensitivity reset signal NH are variable in capacity at the time of read out, so that the value of gain G in the above-mentioned formula (1) varies according to the value of the capacity.

The arithmetic processing mentioned above permits smooth switching from the signal for low illuminance to the signal for high illuminance.

In the CMOS image sensors 10, 10A, and 10B, the low-sensitivity second photoelectric conversion section 103 may be provided with the charge storage section 106, so that it is possible to raise the level at which the low-sensitivity data signal SL becomes saturated. This helps enlarge the maximum value of dynamic range while holding the minimum value of dynamic range. The result is an expansion of dynamic range.

In an on-vehicle image sensor, for example, a phenomenon called LED (Light Emitting Diode) flickering sometimes occurs where it is not possible to image a blinking object such as an LED light source depending on the blinking timing. This LED flickering occurs, for example, because the conventional image sensor is low in dynamic range and needs adjustments of exposure time for individual objects.

In other words, the conventional image sensor is so designed as to have a longer exposure time for low-illuminance objects and a shorter exposure time for high-illuminance objects so that it can cope with various objects differing in illuminance. The thus designed image sensor can cope with objects of various illuminance even though it has a low dynamic range. On the other hand, it has a drawback due to the fact that the read-out rate is constant regardless of exposure time. The drawback is that if the exposure time is set shorter than the read-out time, the light which enters the photoelectric conversion section at the time outside the exposure time is photoelectrically converted into charge but the charge is discarded without being read out.

By contrast, the CMOS image sensors 10, 10A, and 10B may have an expanded dynamic range as mentioned above. This permits them to extend the exposure time and suppress the LED flickering.

Moreover, the CMOS image sensors 10, 10A, and 10B are exempt from artifacts and reduced resolution. Artifacts occur when the number of divisions is increased for the time-division system or space-division system, as mentioned above.

8. Modified Examples

The forgoing description covers the examples in which one pixel has two photoelectric conversion sections differing in sensitivity. They may be modified such that one pixel has three or more photoelectric conversion sections. In this case, it is possible that the photoelectric conversion section having the highest sensitivity is not provided with the charge storage section but at least the photoelectric conversion section having the lowest sensitivity is provided with the charge storage section. Moreover, so long as this condition is satisfied, one pixel may be provided with two or more photoelectric conversion sections having identical sensitivity.

Also, the foregoing description covers the embodiments for the CMOS image sensor having unit pixels arranged in a matrix pattern. The application of the present technology is not restricted to the CMOS image sensor. That is, the present technology may be applied to the solid-state imaging device in general of X-Y addressing type which has unit pixels two-dimensionally arranged in a matrix pattern.

Moreover, the present technology is not restricted in its application to the solid-state imaging device which takes images by detecting the distribution of the amount of incident visible light. It may also be applied to the solid-state imaging device in general which takes images by detecting the distribution of the amount of incident infrared rays, X-rays, particles or the like.

Incidentally, the solid-state imaging device may take on a one-chip form or a module form in which an imaging section, a signal processing section, and an optical system are combined into a package and which has an imaging function.

9. Examples of Use of Solid-State Imaging Device

Figure 22:
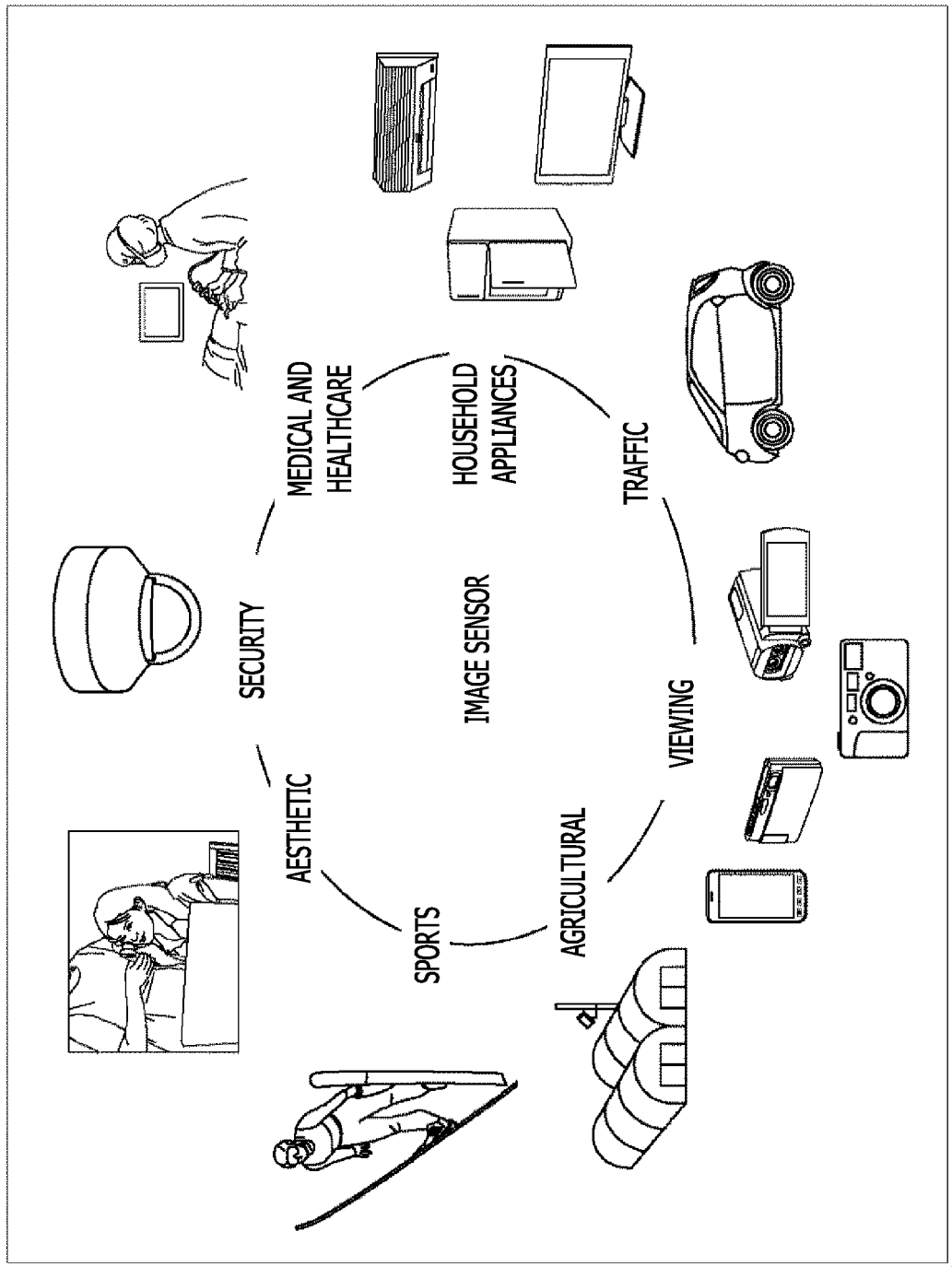
FIG. 22 is a diagram depicting examples of application of a solid-state imaging device.

FIG. 22 depicts examples of use of the solid-state imaging device mentioned above.

The solid-state imaging device mentioned above will find use as sensors for visible light, infrared rays, ultraviolet rays, X-rays, and the like, for example, as listed below.
- Devices for picking up images for viewing use, such as digital cameras and portable apparatuses provided with a camera function
- Devices for traffic use, such as on-vehicle sensors for imaging the front side, the rear side, the surroundings, the interior, etc. of an automobile, a surveillance camera for monitoring a traveling vehicle or a road, a distance measurement sensor for performing measurement of the distance between vehicles and so forth for the purposes of safe driving such as automatic vehicle stop, recognition of the driver's condition, or the like
- Devices for use in household appliances such as TVs, refrigerators and air conditioners for the purpose of imaging a user's gesture and performing an apparatus operation according to the gesture
- Devices for medical or healthcare use, such as endoscopes and devices for imaging blood vessels by receiving infrared light
- Devices for security use, such as surveillance cameras for security and cameras for person authentification
- Devices for aesthetic use, such as a skin measuring instrument for imaging a skin and a microscope for imaging the scalp
- Devices for sports use, such as action cameras and wearable cameras for sports use or the like
- Devices for agricultural use, such as cameras for monitoring conditions of fields and/or farm products {Imaging Device}

FIG. 23 is a block diagram depicting an example of the structure of an imaging device (camera device) 301 as an example of the electronic apparatus to which the present technology is applied.

As depicted in FIG. 23, the imaging device 301 includes an optical system having a lens group and the like, an imaging element 302, a DSP circuit 303 as a camera signal processing section, a frame memory 304, a display unit 305, a recording unit 306, an operating system 307, a power supply system 308, and the like. The DSP circuit 303, the frame memory 304, the display unit 305, the recording unit 306, the operating system 307, and the power supply system 308 are mutually connected through a bus line 309.

The lens group allows the incident light (image light) from an object to enter and form an image on an imaging plane of the imaging element 302. The imaging element 302 converts the amount of incident light for each pixel, which incident light has formed an image on the imaging plane by the lens group, into electrical signals. The electrical signals are subsequently output as pixel signals.

The display unit 305 is a panel-type display unit of liquid crystal or organic EL (electroluminescence); it displays a dynamic image or a static image photographed by the imaging element 302. The recording unit 306 records the dynamic image or static image photographed by the imaging element 302 in a recording medium such as memory card, video tape, and DVD (Digital Versatile Disk).

The operating system 307 causes the imaging device 301 to variously function in response to the user's manipulations. The power supply system 308 appropriately supplies power to the DSP circuit 303, the frame memory 304, the display unit 305, the recording unit 306, and the operating system 307.

The imaging device 301 mentioned above may be applied to video cameras, digital still cameras, and camera modules for mobile equipment such as smart phone and portable telephone. The imaging device 301 may be provided with the solid-state imaging device as exemplified in the above-mentioned embodiments as the imaging element 312. In this way, the imaging device 301 is improved in image quality.

The embodiments of the present technology are not restricted to those mentioned above. They may be variously modified within the extent not departing from the scope of the present technology.

For example, the above-mentioned embodiments may be properly combined together. For example, the second embodiment may be combined with any of the third to fifth embodiments.

Also, the present technology may be constituted as exemplified in the following.

(1) A solid-state imaging device including:
a pixel array section configured to have a plurality of unit pixels arranged therein; and
a drive section configured to control action of the unit pixels,
wherein each of the unit pixels includes
a first photoelectric conversion section,
a second photoelectric conversion section which is less sensitive than the first photoelectric conversion section,
a charge storage section configured to store charges generated by the second photoelectric conversion section,
a charge-voltage conversion section,
a first transfer gate section configured to transfer charges from the first photoelectric conversion section to the charge-voltage conversion section, and
a second transfer gate section configured to combine potential of the charge-voltage conversion section with potential of the charge storage section.

(2) The solid-state imaging device according to (1) above, wherein the unit pixel further includes
a third transfer gate section configured to transfer charges from the second photoelectric conversion section to the charge storage section, and an overflow path which is formed under a gate electrode of the third transfer gate section and transfers overflown charges from the second photoelectric conversion section to the charge storage section.

(3) The solid-state imaging device according to (1) above, wherein the second photoelectric conversion section and the charge storage section are connected to each other, with a transfer gate section omitted.

(4) The solid-state imaging device according to any one of (1) to (3) above,
wherein the unit pixel further includes
a fourth transfer gate section which is connected between the second transfer gate section and the charge-voltage conversion section.

(5) The solid-state imaging device according to (4) above, wherein the drive section is configured to make the fourth transfer gate section conductive or non-conductive when a signal based on charges generated by the first photoelectric conversion section is read out.

(6) The solid-state imaging device according to any one of (1) to (5) above, wherein the drive section is configured to make the second transfer gate section non-conductive when a first data signal based on charges generated by the first photoelectric conversion section is read out and also make the second transfer gate section conductive when a second data signal based on charges generated by the second photoelectric conversion section is read out.

(7) The solid-state imaging device according to (6) above, wherein, when reading out the first data signal, the drive section reads out the first data signal after a first reset signal has been read out, with the charge-voltage conversion section kept reset, and when reading out the second data signal, the drive section reads out a second reset signal after the second data signal has been read out, with the region kept reset in which potential of the charge-voltage conversion section is combined with potential of the charge storage section.

(8) The solid-state imaging device according to (7) above, further including:
a signal processing section configured to generate a first difference signal representing difference between the first data signal and the first reset signal and a second difference signal representing difference between the second data signal and the second reset signal, use the first difference signal for a pixel signal of the unit pixel if the first difference signal has a value equal to or lower than a given threshold value, and use the second difference signal for a pixel signal of the unit pixel if the first difference signal has a value exceeding the threshold value.

(9) The solid-state imaging device according to (7) above, further including:
a signal processing section configured to generate pixel signals of the unit pixels by generating a first difference signal representing difference between the first data signal and the first reset signal and a second difference signal representing difference between the second data signal and the second reset signal, and then synthesizing the first difference signal and the second difference signal according to a synthesis ratio set up based on the value of the first difference signal.

(10) The solid-state imaging device according to (1) to (9) above,
wherein the charge storage section has its counter electrode connected to a variable voltage source, and the drive section keeps voltage applied to the counter electrode of the charge storage section in a period for storing charges in the charge storage section lower than in a period in which signals based on charges stored in the charge storage section are read out.

(11) A method for driving a solid-state imaging device including
a pixel array section configured to have a plurality of unit pixels arranged therein,
each of the unit pixels including
a first photoelectric conversion section,
a second photoelectric conversion section which is less sensitive than the first photoelectric conversion section,
a charge storage section,
a charge-voltage conversion section,
a first transfer gate section configured to transfer charges from the first photoelectric conversion section to the charge-voltage conversion section, and
a second transfer gate section configured to combine potential of the charge-voltage conversion section with potential of the charge-storage section, the method including:
storing charges generated by the second photoelectric conversion section in the charge storage section;
when a first data signal based on charges generated by the first photoelectric conversion section is read out, making the second transfer gate section non-conductive and transferring charges stored in the first photoelectric conversion section to the charge-voltage conversion section; and
when a second data signal based on charges generated by the second photoelectric conversion section is read out, making the second transfer gate section conductive and combining potential of the charge-voltage conversion section with potential of the charge storage section.

(12) An electronic apparatus including:
a solid-state imaging device including
a pixel array section configured to have a plurality of unit pixels arranged therein, and
a drive section configured to control action of the unit pixels;
each of the unit pixels including
a first photoelectric conversion section,
a second photoelectric conversion section which is less sensitive than the first photoelectric conversion section,
a charge storage section configured to store charges generated by the second photoelectric conversion section,
a charge-voltage conversion section,
a first transfer gate section configure to transfer charges from the first photoelectric conversion section to the charge-voltage conversion section, and
a second transfer gate section configured to combine potential of the charge-voltage conversion section with potential of the charge-storage section.

REFERENCE SIGNS LIST 10, 10A, 10B . . . CMOS image sensor
11 . . . Pixel array section
12 . . . Vertical drive section
13 . . . Column processing section
14 . . . Horizontal drive section
15 . . . System control section
16 . . . Pixel drive line
17 . . . Vertical signal line
18 . . . Signal processing section
19 . . . Data storage section
100A to 100F . . . Unit pixel
101 . . . First photoelectric conversion section
102 . . . First transfer gate section 103 . . . Second photoelectric conversion section
104 . . . Second transfer gate section
105 . . . Third transfer gate section
106 . . . Charge storage section
107 . . . Reset gate section
108 . . . FD section
109 . . . Amplifying transistor
110 . . . Selective transistor
151 . . . Fourth transfer gate section
152 . . . Node
301 . . . Imaging device
312 . . . Imaging element

What is claimed is:

1. An imaging device, comprising:
a plurality of pixels including a first pixel, the first pixel including:
a first photoelectric converter having a first photosensitivity;
a first transfer transistor coupled to the first photoelectric converter;
a first capacitor coupled to the first transfer transistor;
a second transfer transistor coupled to the first capacitor;
a first floating node coupled to the second transfer transistor;
a reset transistor coupled to the first floating node;
a second photoelectric converter having a second photosensitivity higher than the first photosensitivity;
a third transfer transistor coupled to the second photoelectric converter;
a second floating node coupled to the third transfer transistor;
an amplifier transistor coupled to the first floating node through the second floating node and coupled to a first analog to digital converter configured to receive a first signal based on an output from the first pixel;
an overflow path which is formed under a gate electrode of the first transfer transistor and transfers overflown charges from only the first photoelectric conversion section to the first capacitor;
and a fourth transfer transistor coupled between the reset transistor and the second floating node.

2. The imaging device according to claim 1, wherein the first capacitor is coupled to a ground.

3. The imaging device according to claim 1, wherein the first pixel includes a select transistor.

4. The imaging device according to claim 3, wherein the select transistor is coupled to the first analog to digital converter through a first vertical signal line.

5. The imaging device according to claim 1, wherein the first photoelectric converter has a light-receiving region that is smaller than the light receiving region of the second photoelectric converter.

6. The imaging device according to claim 1, wherein a first terminal of the first capacitor is coupled to the first transfer transistor, and wherein the first node of the first capacitor is coupled to the second transfer transistor.

7. The imaging device according to claim 6, wherein a second terminal of the first capacitor is coupled to a ground.

8. The imaging device according to claim 1, wherein the first capacitor forms a charge storage section.

9. An electronic apparatus, comprising:
an imaging device, including:
a plurality of pixels including a first pixel, the first pixel including:
a first photoelectric converter having a first photosensitivity;
a first transfer transistor coupled to the first photoelectric converter;
a first capacitor coupled to the first transfer transistor;
a second transfer transistor coupled to the first capacitor;
a first floating node coupled to the second transfer transistor;
a reset transistor coupled to the first floating node;
a second photoelectric converter having a second photosensitivity higher than the first photosensitivity;
a third transfer transistor coupled to the second photoelectric converter;
a second floating node coupled to the third transfer transistor;
an amplifier transistor coupled to the first floating node through the second floating node and coupled to a first analog to digital converter configured to receive a first signal based on an output from the first pixel;
an overflow path which is formed under a gate electrode of the first transfer transistor and transfers overflown charges from only the first photoelectric conversion section to the first capacitor;
and a fourth transfer transistor coupled between the reset transistor and the second floating node;
a column processing section, wherein the column processing section includes the first analog to digital converter;
and a signal processing section that processes signals output from the column processing section.

10. The electronic apparatus according to claim 9, wherein the first capacitor is coupled to a ground.

11. The electronic apparatus according to claim 9, wherein the first pixel includes a select transistor.

12. The electronic apparatus according to claim 11, wherein the select transistor is coupled to the first analog to digital converter through a first vertical signal line.

13. The electronic apparatus according to claim 9, wherein the first photoelectric converter has a light-receiving region that is smaller than the light receiving region of the second photoelectric converter.

14. The electronic apparatus according to claim 9, wherein a first terminal of the first capacitor is coupled to the first transfer transistor, and wherein the first node of the first capacitor is coupled to the second transfer transistor.

15. The electronic apparatus according to claim 14, wherein a second terminal of the first capacitor is coupled to a ground.

16. The electronic apparatus according to claim 9, wherein the first capacitor forms a charge storage section.

* * * * *